US011087803B2

(12) United States Patent
Zhang et al.

(10) Patent No.: US 11,087,803 B2
(45) Date of Patent: Aug. 10, 2021

(54) EFFICIENT CONTROL OF MEMORY CORE CIRCUITS

(71) Applicant: SanDisk Technologies LLC, Addison, TX (US)

(72) Inventors: Yuheng Zhang, Saratoga, CA (US); Po-Shen Lai, Palo Alto, CA (US); Hao Su, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/905,229

(22) Filed: Jun. 18, 2020

(65) Prior Publication Data

US 2020/0321037 A1 Oct. 8, 2020

Related U.S. Application Data

(63) Continuation of application No. 16/453,012, filed on Jun. 26, 2019, now Pat. No. 10,777,240.

(Continued)

(51) Int. Cl.
*G11C 7/22* (2006.01)
*G11C 7/10* (2006.01)
(Continued)

(52) U.S. Cl.
CPC .............. *G11C 7/1072* (2013.01); *G11C 7/22* (2013.01); *G11C 11/1693* (2013.01); *G11C 13/0061* (2013.01); *G11C 16/32* (2013.01)

(58) Field of Classification Search
CPC ...................................................... G11C 7/22
See application file for complete search history.

(56) References Cited

U.S. PATENT DOCUMENTS

| 5,509,134 A | 4/1996 | Fandrich et al. |
| 6,345,348 B2 | 2/2002 | Watanabe et al. |

(Continued)

FOREIGN PATENT DOCUMENTS

EP 2211271 A2 7/2010

OTHER PUBLICATIONS

Notice of Allowance dated Jun. 18, 2020, U.S. Appl. No. 16/453,012, filed Jun. 26, 2019.

(Continued)

*Primary Examiner* — David E Martinez
(74) *Attorney, Agent, or Firm* — Vierra Magen Marcus LLP

(57) ABSTRACT

An apparatus including a memory structure comprising non-volatile memory cells and a microcontroller. The microcontroller is configured to output Core-Timing-Control (CTC) signals. The CTC signals are used to control voltages that are applied in the memory structure. For example, CTC signals may be used to control the timing of voltages applied to word lines, bit lines, select lines, and other elements or control lines in the memory core. The microcontroller is configured to output CTC signals having many different variations under various modes/parameter conditions. The apparatus may include storage containing reaction data according to dynamic conditions. The microcontroller may be configured to lookup or compute the CTC signals based on the dynamic conditions and the reaction data. Various data storage formats are disclosed, which can be used to efficiently store many varieties of data with minimum usage of memory.

20 Claims, 25 Drawing Sheets

Related U.S. Application Data

(60) Provisional application No. 62/815,037, filed on Mar. 7, 2019.

(51) Int. Cl.
  *G11C 13/00* (2006.01)
  *G11C 11/16* (2006.01)
  *G11C 16/32* (2006.01)

(56) References Cited

U.S. PATENT DOCUMENTS

| | | | |
|---|---|---|---|
| 6,393,561 B1 | 5/2002 | Hagiwara et al. | |
| 6,545,891 B1 | 4/2003 | Tringali et al. | |
| 6,721,843 B1 | 4/2004 | Estakhri | |
| 6,754,765 B1 | 6/2004 | Chang et al. | |
| 6,754,828 B1 | 6/2004 | Marisetty et al. | |
| 6,765,813 B2 | 7/2004 | Scheuerlein et al. | |
| 6,772,276 B2 | 8/2004 | Dover | |
| 7,574,611 B2 | 8/2009 | Cohen | |
| 7,594,055 B2 | 9/2009 | Gower et al. | |
| 7,600,090 B2 | 10/2009 | Cohen et al. | |
| 7,620,784 B2 | 11/2009 | Panabaker | |
| 7,676,640 B2 | 3/2010 | Chow et al. | |
| 7,788,553 B2 | 8/2010 | Chow et al. | |
| 8,074,022 B2 | 12/2011 | Okin et al. | |
| 8,131,915 B1 | 3/2012 | Yang | |
| 8,219,780 B2 | 7/2012 | Callister et al. | |
| 8,327,161 B2 | 12/2012 | Cohen | |
| 8,365,114 B2 | 1/2013 | Arbel et al. | |
| 8,417,448 B1 | 4/2013 | Denise | |
| 8,639,903 B2 * | 1/2014 | Barkley | G11C 13/0064 711/169 |
| 8,683,149 B2 | 3/2014 | Ware et al. | |
| 8,687,423 B2 | 4/2014 | Yoo | |
| 8,811,110 B2 | 8/2014 | Schaefer et al. | |
| 8,843,731 B2 | 9/2014 | Bueb et al. | |
| 9,116,620 B2 | 8/2015 | Lassa et al. | |
| 9,208,261 B2 | 12/2015 | Shah et al. | |
| 9,583,220 B2 | 2/2017 | Tsai et al. | |
| 9,600,191 B2 | 3/2017 | Pawlowski | |
| 9,858,242 B2 | 1/2018 | Palmer et al. | |
| 2009/0083476 A1 | 3/2009 | Pua et al. | |
| 2010/0122097 A1 | 5/2010 | Cohen | |
| 2011/0283081 A1 | 11/2011 | Barkley | |
| 2012/0020155 A1 | 1/2012 | Kim | |
| 2012/0210056 A1 | 8/2012 | Okabe et al. | |
| 2018/0039535 A1 | 2/2018 | Tehrani et al. | |
| 2019/0179532 A1 | 6/2019 | Tseng et al. | |
| 2019/0179568 A1 | 6/2019 | Hsu et al. | |
| 2019/0179573 A1 | 6/2019 | Hsu et al. | |
| 2019/0180824 A1 | 6/2019 | Hsu | |

OTHER PUBLICATIONS

Intel, "Max 10 User Flash Memory User Guide," UG-M10UFM, Feb. 21, 2017, 29 pages.
Intel, "An 741: Remote System Upgrade for Max 10 FPGA Devices over UART with the Nios II Processor," AN-741, Feb. 21, 2017, 15 pages.
Gupta, Megha et al., "Design and Implementation of Content Addressable Memory (CAM) Architecture," International Journal of Science and Research, vol. 4, Issue 10, Oct. 2015, 4 pages.
Wentzlaff, David, "ELE 475 / COS 475, Computer Architecture, Lecture 10: Advanced Caches," Powerpoint, Dept. of Electrical Engineering, Princeton University, Apr. 2012, 68 pages.
U.S. Appl. No. 16/453,012, filed Jun. 26, 2019.

* cited by examiner

| CTC Signal | Mode | Sub-Mode | Main_CLk | Sub_clock | Condition | Set/Reset |
|---|---|---|---|---|---|---|
| CTC Signal 1 | Progam | ABL Program | P_CLK | p1 | A OR B | SET |
| CTC Signal 1 | Progam | ABL Program | P_CLK | p9 | C | RESET |
| CTC Signal 2 | Progam | SLC Program | P_CLK | p4 | NOT D | SET |
| CTC Signal 2 | Progam | SLC Program | P_CLK | p6 | E AND F | RESET |
| CTC Signal 2 | Progam | MLC Program | P_CLK | p5 | NOT D | SET |
| CTC Signal 2 | Progam | MLC Program | P_CLK | p7 | E AND F | RESET |
| CTC Signal 3 | Progam | MLC Program | P_CLK | p4 | NOT G | SET |
| CTC Signal 3 | Progam | MLC Program | P_CLK | p7 | G AND H | RESET |
| CTC Signal 1 | Read | SLC Read | R_CLK | r1 | I AND J | SET |
| CTC Signal 1 | Read | SLC Read | R_CLK | r4 | I AND K | RESET |
| CTC Signal 2 | Read | MLC Read | R_CLK | r1 | I AND J | SET |
| CTC Signal 2 | Read | MLC Read | R_CLK | r5 | I AND K | RESET |
| CTC Signal 2 | Read | SLC Read | R_CLK | r2 | I AND J AND L | SET |
| CTC Signal 4 | Read | SLC Read | R_CLK | r4 | I AND K AND L | RESET |
| CTC Signal 4 | Read | MLC Read | R_CLK | r3 | M and NOT P | SET |
| CTC Signal 5 | Read | MLC Read | R_CLK | r6 | NOT P OR Q | RESET |

CTC Signals (1900):

| | 0 | | 1 | | 2 | | 3 | | 4 | | 5 | | 6 | | 7 | | 8 | | 9 | | 10 | | 11 | | 12 | | 13 | | 14 | |
|---|---|---|---|---|---|---|---|---|---|---|---|---|---|---|---|---|---|---|---|---|---|---|---|---|---|---|---|---|---|---|
| | R | S | R | S | R | S | R | S | R | S | R | S | R | S | R | S | R | S | R | S | R | S | R | S | R | S | R | S | R | S |
| | 0 | 0 | 0 | 0 | 0 | 1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |

1902:

| Addr | Sig | Res |
|---|---|---|
| | S/R | |
| 1 | Val | |
| 2 | Val | |
| 3 | Val | |

| Addr | S/R | CTC Signal | | | | | | | | | | | | | | |
|---|---|---|---|---|---|---|---|---|---|---|---|---|---|---|---|---|
| | | 14 | 13 | 12 | 11 | 10 | 9 | 8 | 7 | 6 | 5 | 4 | 3 | 2 | 1 | 0 |
| | 1 | 0 | 0 | 0 | 0 | 0 | 0 | 0 | 1 | 0 | 0 | 0 | 0 | 1 | 0 | 0 |
| | 0 | 0 | 0 | 0 | 0 | 0 | 0 | 0 | 0 | 0 | 0 | 0 | 0 | 0 | 1 | 0 |

| Addr | S/R | CTC Signal | | | | | | | | | | | | | | |
|---|---|---|---|---|---|---|---|---|---|---|---|---|---|---|---|---|
| | | 14 | 13 | 12 | 11 | 10 | 9 | 8 | 7 | 6 | 5 | 4 | 3 | 2 | 1 | 0 |
| 1 | 1 | 0 | 0 | 0 | 0 | 0 | 0 | 0 | 0 | 0 | 1 | 0 | 0 | 1 | 0 | 0 |
| 2 | | | | | | | | | | | | | | | | | |

FIG. 20

EFFICIENT CONTROL OF MEMORY CORE CIRCUITS

CLAIM OF PRIORITY

The present application is a continuation application of U.S. patent application Ser. No. 16/453,012, entitled "EFFICIENT CONTROL OF MEMORY CORE CIRCUITS," by Zhang et al., filed Jun. 26, 2019 and issued as U.S. Pat. No. 10,777,240 on Sep. 15, 2020, which claims priority from U.S. Provisional Patent Application No. 62/815,037, entitled "EFFICIENT CONTROL OF MEMORY CORE CIRCUITS," by Zhang et al., filed Mar. 7, 2019, incorporated by reference herein in their entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 10B depicts one embodiment of master table pertaining to CTC signals.

FIG. 19 depicts reaction for an embodiment having a 30-bit format.

FIG. 20 depicts reaction data for an embodiment having a 16-bit format.

DETAILED DESCRIPTION

Figure 1:
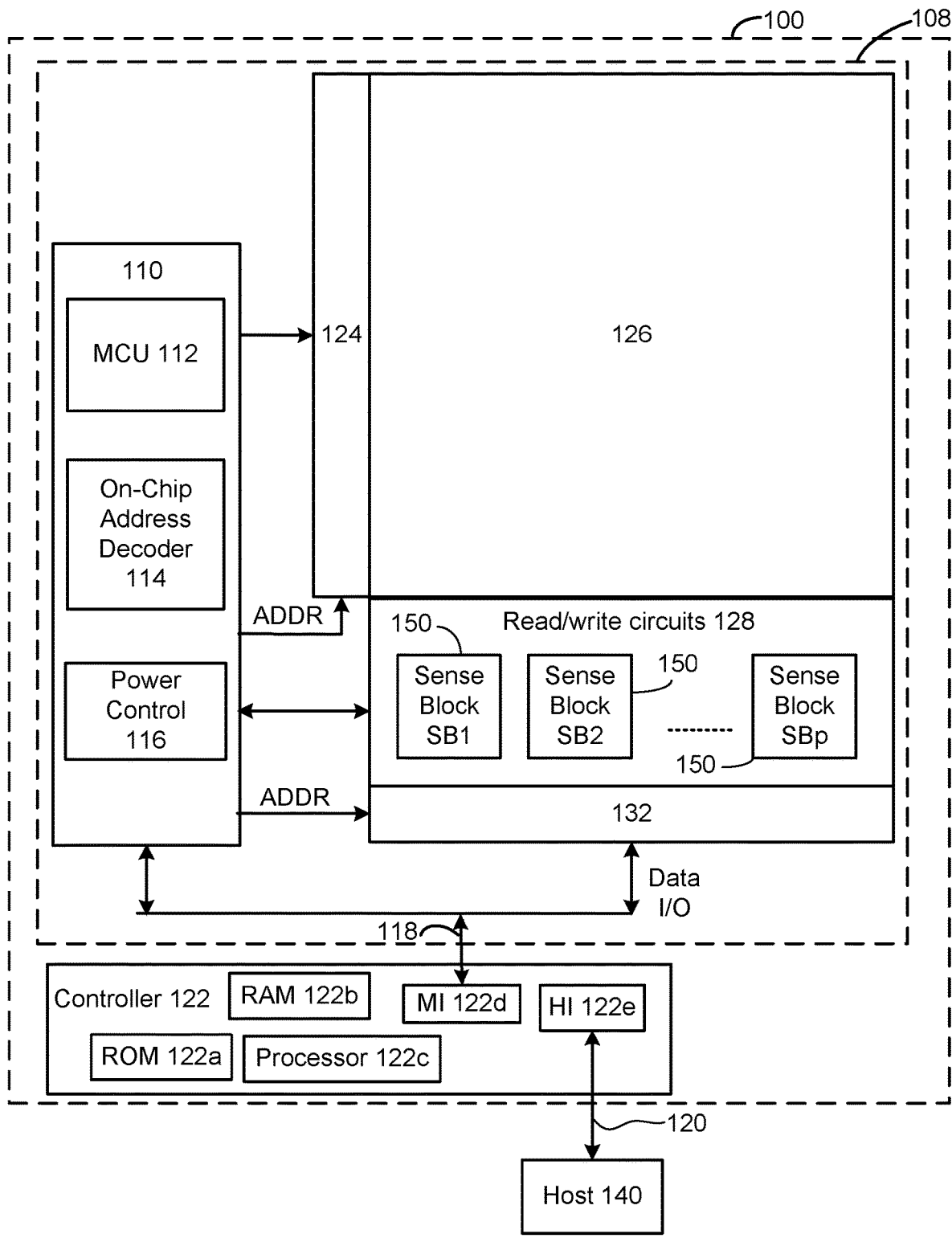
FIG. 1 is a functional block diagram of a memory device.

A proposed non-volatile memory system includes a memory structure and a control circuit connected to the memory structure. The memory structure includes non-volatile memory cells. The control circuit may include a programmable and reprogrammable microcontroller (e.g., MCU), in an embodiment. In one embodiment, the microcontroller is configured to output Core-Timing-Control (CTC) signals. The CTC signals are used to control voltages that are applied in the memory structure to control memory operations such as program, read, and erase. In one embodiment, the MCU sets or resets CTC signals during a memory operation in order to control the voltages. For example, the CTC signals may be used to control the timing of voltages applied to word lines, bit lines, select lines, and other elements or control lines in the memory structure. The MCU is used in a bit-cost-scalable (BiCs) architecture, in some embodiments.

A CTC signal is set or reset in response to a dynamic condition being met, in an embodiment. A dynamic condition may be based on temperature, reference voltages, mode of operation, etc. A dynamic condition is met if a combination of modes, parameters, and/or state dependent bits are applicable for a segment of a memory operation, in an embodiment. The segment of the memory operation is referred to herein as a sub-clock. Generating the CTC signals is very complex due in part to the various modes, parameters, as well as state dependent bits. A few example modes include, but are not limited to, SLC program (program a single bit per memory cell), MLC program (programs multiple bits per memory cell), SLC read (reads a single bit per memory cell), MLC read (reads multiple bits per memory cell).

There are potentially a large number of CTC signals in order to handle all of the various dynamic conditions. One challenge is to reduce the amount of storage needed to determine which CTC signals should be set or reset. For example, pre-storing a multitude of variations of CTC signals could result in large memory size. Another challenge is to meet timing requirements of the CTC signals. An embodiment of an MCU in a non-volatile memory system generates CTC signals while efficiently using storage needed to determine the timing for setting and/or resetting CTC signals during a memory operation. In one embodiment, there are several different formats for stored reaction data, which is used to specify how to set/reset CTC signals in response to conditions being met. An embodiment of an MCU in a non-volatile memory system generates CTC signals while meeting complex timing requirements.

Memory devices, such as 3D NAND devices, have great logic complexities. Performance parameters are often fine-tuned. One technique to fine-tune performance parameters is through trim fuses, of which there may be thousands. However, often satisfactory changes are beyond the trim fuses' control range. For instance, structural changes in the timing of setting/resetting CTC signals is difficult or impossible to control with trim fuses. When such needs arise, and/or when there are implementation flaws (bugs) in the logic circuits, Engineering Change Orders (ECOs) are one possible solution. ECOs are metal layer changes and typically result in months of product delays and sometimes significant material waste in silicon production.

One possible solution to provide CTC signals is to use combinational logic. However, combinational logic is not flexible and the only method to change the implementation is through metal layers changes in silicon. Embodiments of a memory device has an MCU that generates CTC signals. The MCU balances computing efficiency and memory storage.

An embodiment uses a distributed approach for generating CTC signals. The CTC signals are divided into groups based on, for example, types of memory operations affected by the CTC signals. Reaction data is stored for each group of CTC signals, in an embodiment. The reaction data specifies whether to set/reset CTC signals in the group in response to a condition being met during a segment of a memory operation. In one embodiment, the segment is a sub-clock of a memory operation. In one embodiment, a centralized processing unit (e.g., SEQ_MACHINE, or SM) computes real time conditions (e.g., conditions that are met during a sub-clock of a memory operation) and places packets onto a First-In First-Out (FIFO) buffer. One or more second processing units (e.g., CTC Machines, or CMs) access the FIFO, and efficiently lookup or compute the CTC signals to issue based on information in the packets and the reaction data.

In an embodiment, the reaction data has different formats that use a different number of bits to store the reaction data for a met condition. Four data storage formats are disclosed in one embodiment herein, which can be used to efficiently store many varieties of data with minimum usage of memory.

This method saves the memory size and is still fast enough so there is no latency penalty, in an embodiment. Embodiments disclosed hereon enables flexible memory products, with reduced design and manufacturing costs, by significantly reducing the number of metal changes (Engineering Change Orders, or ECOs) required for each generation of memory products.

One embodiment includes an apparatus including a memory structure, and an MCU that has a first processor, a second processor, and a third processor. The first processor is configured to execute a first set of instructions to direct the second processor to execute a second set of instructions to control a first circuit to coordinate sequences of voltages applied to the memory structure for a particular memory operation. The first processor is configured to direct the third processor to execute a third set of the instructions to control a second circuit to test a condition of a group of the non-volatile memory cells for the particular memory operation. The first processor is referred to as a "Main Processor," in one embodiment. The first processor is referred to as a "SEQ_Machine," in one embodiment. The second processor is referred to as a "Core Processor," in one embodiment. The second processor is referred to as a "Core Machine (CM)," in one embodiment. The third processor is referred to as a "Sense Processor," in one embodiment. The third processor is referred to as a "YLOG Machine," in one embodiment.

Each of the processors has access to storage which contains instructions executed by the processor. The instructions can be modified by replacing the instructions in the storage, which provides great flexibility. Thus, updates and/or design changes can be made with firmware updates rather than hardware or circuit changes. Thus, design changes are much more flexible compared to, for example, an architecture in which a hard-wired state machine is used instead of the processors. Therefore, timing of CTC signals can easily be modified by firmware updates.

Figure 2:
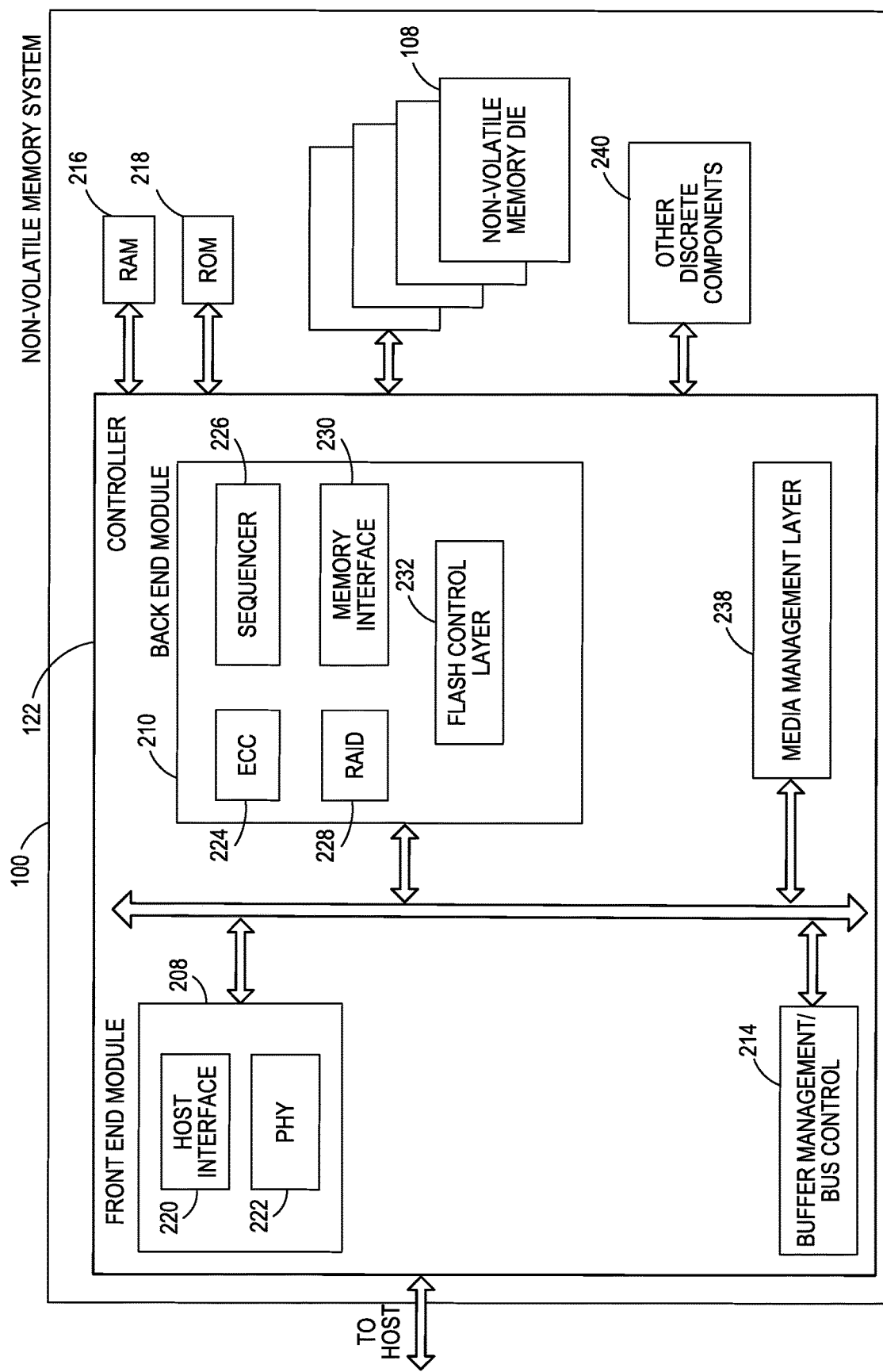
FIG. 2 is a block diagram depicting one embodiment of a memory system.
Figure 3:
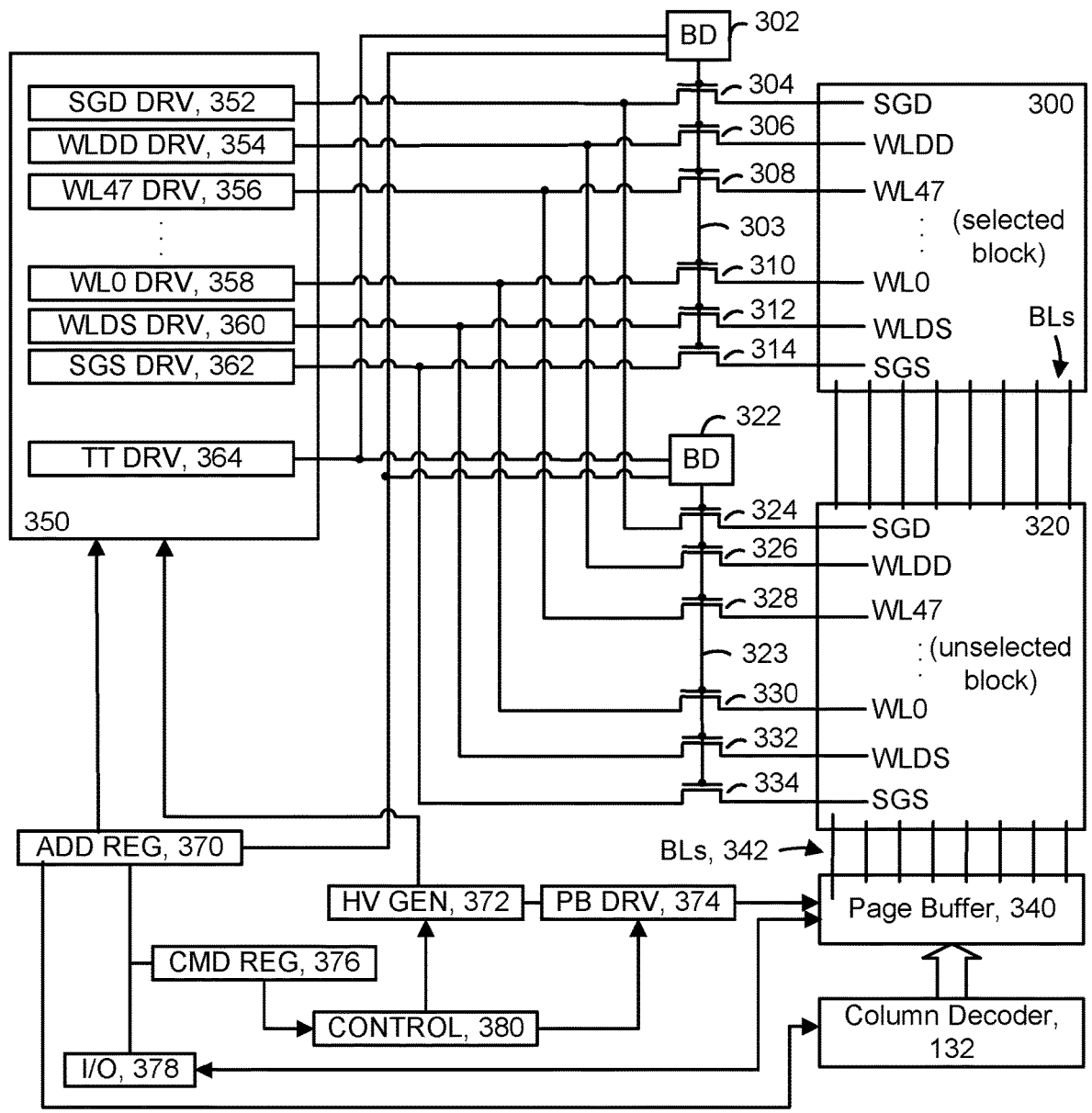
FIG. 3 depicts an embodiment of circuits for applying voltages to a memory structure.

FIGS. 1-3 describe one set of examples of a memory system that can be used to implement the technology described herein. FIG. 1 is a functional block diagram of an example memory system 100. The components depicted in FIG. 2 are electrical circuits. Memory system 100 includes one or more memory die 108. The one or more memory die 108 can be complete memory die or partial memory die.

In one embodiment, each memory die 108 includes a memory structure 126, control circuitry 110, and read/write circuits 128. Memory structure 126 is addressable by word lines via a row decoder 124 and by bit lines via a column decoder 132. Read/write circuits 128 include multiple sense blocks 150 including SB1, SB2, . . . , SBp (sensing circuitry) and allow a page of memory cells to be read or programmed in parallel.

In some systems, a controller 122 is included in the same package (e.g., a removable storage card) as the one or more memory die 108. However, in other systems, controller 122 can be separated from memory die 108. In some embodiments controller 122 will be on a different die than the memory die 108. In some embodiments, a single controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a programmable and reprogrammable microcontroller (MCU) 112, an on-chip address decoder 114, and a power control circuit 116. Microcontroller 112 provides die-level control of memory operations. In an embodiment, microcontroller 112 is programmable by software. In other embodiments, microcontroller 112 does not use software and is completely implemented in hardware (e.g., electrical circuits). In an embodiment, control circuitry 110 includes buffers such as registers, ROM fuses and other storage devices for storing default values such as base voltages and other parameters.

On-chip address decoder 114 provides an address interface between addresses used by host 140 or controller 122 to the hardware address used by row decoder 124 and column decoder 132. Power control circuit 116 controls the power and voltages supplied to the word lines and bit lines during memory operations. Power control circuit 116 may include charge pumps for creating voltages. Sense blocks 150 include bit line drivers.

Microcontroller 112 and/or controller 122 (or equivalently functioned circuits), in combination with all or a subset of the other circuits depicted in FIG. 2, can be considered to be one or more control circuits that performs the functions described herein. The one or more control circuits can include hardware only or a combination of hardware and software (including firmware). For example, a controller programmed by firmware to perform the functions described herein is one example of a control circuit. The one or more control circuits can include a processor, Field Programmable Gate Array (FPGA), Application Specific Integrated Circuit (ASIC), integrated circuit or other type of circuit.

In an embodiment, control circuitry 110 (including microcontroller 112), read/write circuits 128, decoders 124 and decoders 132 are positioned on the substrate and underneath memory structure 126, which may be referred to as a "circuit under array."

Controller 122 (which in one embodiment is an electrical circuit) may include one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in memory structure 126, such as a reserved area of memory cells connected to one or more word lines. RAM 122b can be to store data for controller 122, including caching program data (discussed below).

Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 via data bus 120 to receive commands, addresses and/or data from host 140 to provide data and/or status to host 140.

In one embodiment, memory structure 126 includes a three dimensional memory array of non-volatile memory cells in which multiple memory levels are formed above a substrate, such as a wafer. Memory structure 126 may include any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 includes a two dimensional memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1A:
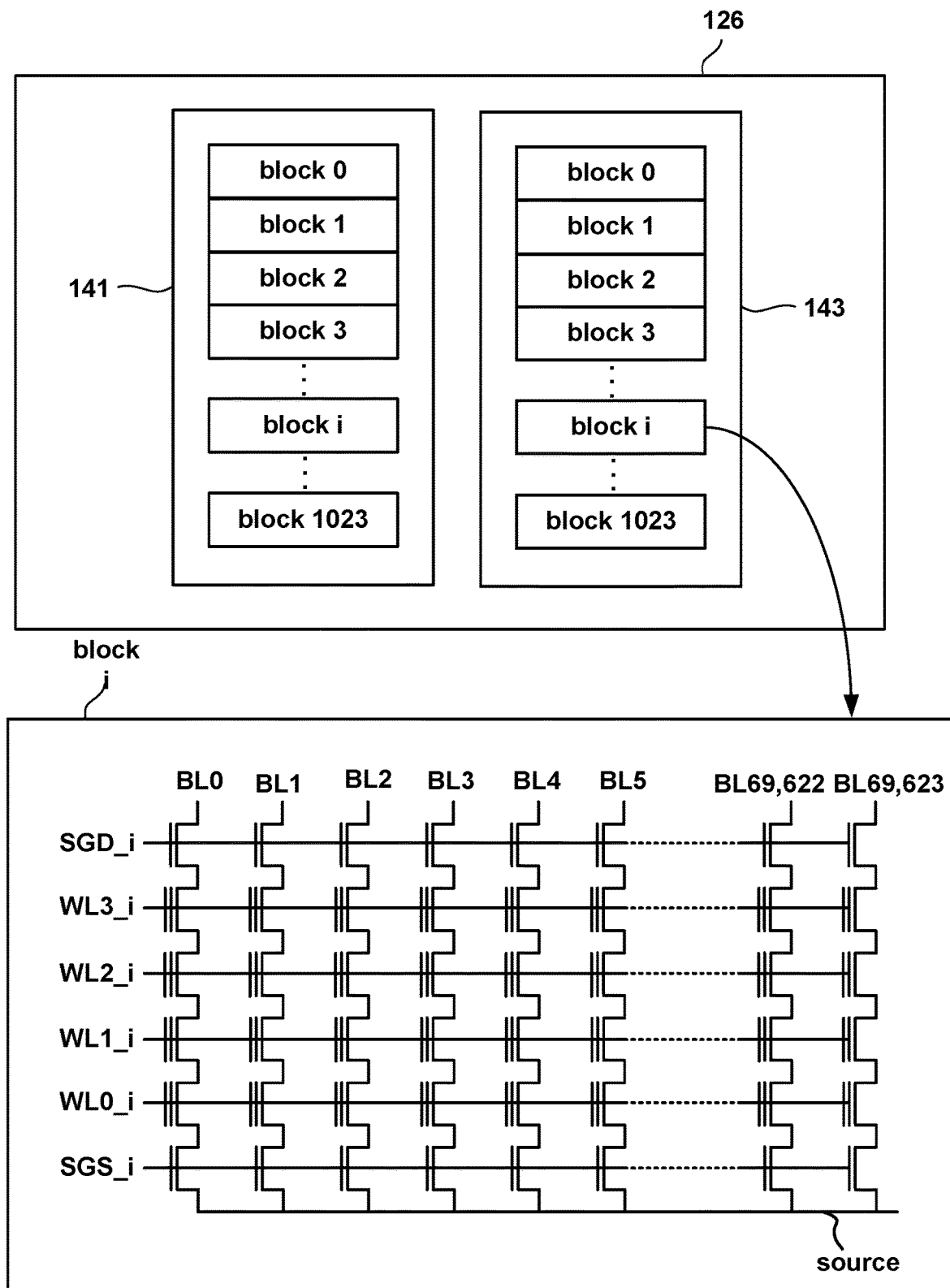
FIG. 1A is a block diagram depicting one example of a memory structure.

FIG. 1A depicts an example of memory structure 126. In one embodiment, an array of memory cells is divided into multiple planes. In the example of FIG. TA, memory structure 126 is divided into two planes: plane 141 and plane 143. In other embodiments, more or less than two planes can be used. In some embodiments, each plane is divided into a number of memory erase blocks (e.g., blocks 0-823, or another amount).

In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase also can be used. In other memory technologies (e.g., MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines. For example, erase block i of FIG. 1A includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1A shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1A shows 69624 bit lines, a different number of bit lines also can be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data are being written into the array, and also checks the ECC when data are being read from the array. In one embodiment, a page includes data stored in all memory cells connected to a common word line.

In the example discussed above, the unit of erase is a memory erase block and the unit of programming and reading is a page. Other units of operation also can be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

Figure 1B:
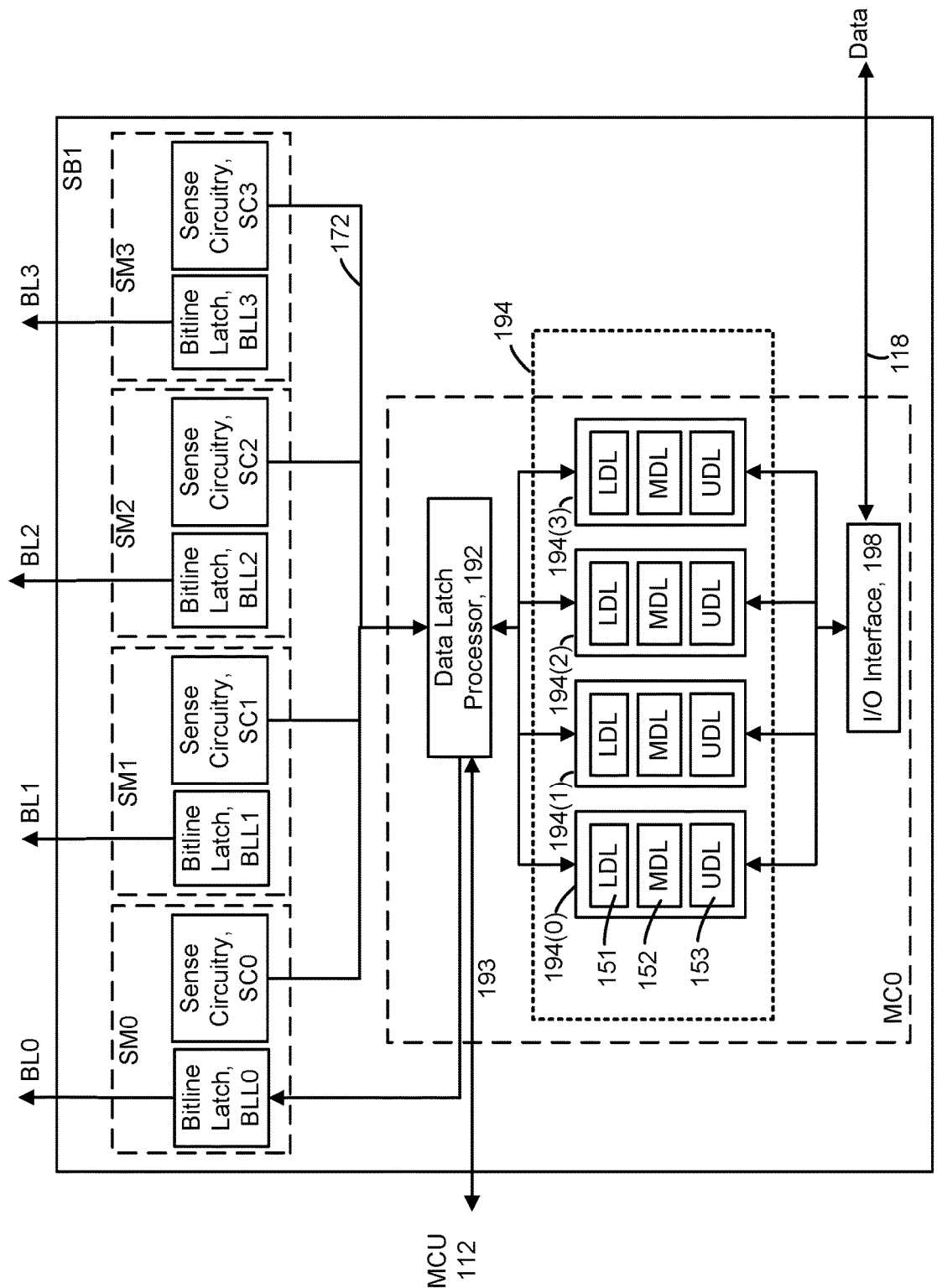
FIG. 1B is a block diagram depicting one embodiment of the sense block SB1 of FIG. 1A.

FIG. 1B is a block diagram depicting one embodiment of the sense block SB1 of FIG. 1. Sense block SB1 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 includes sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 includes a data latch processor 192, four example sets of data latches 194(0), 194(1), 194(2) and 194(3) and an I/O interface 198 coupled between the sets of data latches 194 and lines 118. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3.

Each set of data latches includes data latches identified by LDL 151, MDL 152, and UDL 153, in this embodiment. LDL 151 stores a bit for a lower page of write data, MDL 152 stores a bit for a middle page of write data, and UDL 153 stores a bit for an upper page of write data, in a memory which stores three bits of data in each memory cell. Note that there may be one set of such latches associated with each bit line. The latches 194 also may be used to store data read from the non-volatile memory cells.

Additional or fewer data latches per set could be used as well. For example, in a two-bit per memory cell implementation, the MDL data latch for the middle page of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its threshold voltage is within a specified margin of the verify voltage of its target data state.

Data latch processor 192 performs computations during reading and programming. For reading, data latch processor 192 determines the data state stored in the sensed memory cell and stores the data in the set of data latches. For full programming and refresh programming, data latch processor 192 reads the latches to determine the data state which is to be written to a memory cell.

During reading, the operation of the system is under the control of microcontroller 112 which controls the supply of different control gate voltages to the addressed memory cell.

As it steps through the various predefined control gate voltages corresponding to the various memory states supported by the memory, the sense module may trip at one of these voltages and a corresponding output will be provided from the sense module to data latch processor 192 via data bus 172. At that point, data latch processor 192 determines the memory state by considering the tripping event(s) of the sense module and the information about the applied control gate voltage from microcontroller 112 via input lines 193.

Data latch processor 192 then computes a binary encoding for the memory state and stores the resultant data bits into the data latches 194. For example, the memory state for a memory cell associated with bit line BL0 may be stored in latches 194(0), etc. Herein, a "memory state" may also be referred to as a "data state." In another embodiment of the managing circuit MC0, the bit line latch serves both as a latch for latching the output of the sense module and also as a bit line latch as described above.

In an embodiment, MCU 112 executes instructions to control data latch processor 192 to test conditions of non-volatile memory cells in response to voltages applied to memory structure 126 (such as reference voltages applied to the non-volatile memory cells). The condition of a non-volatile memory cell can be any physical parameter of a non-volatile memory cell. Example conditions include, but are not limited to, a data state (e.g., S0-S7 in FIG. 4), a conduction current, a resistance, and a transistor threshold voltage. The manner in which the condition may be tested may include, but is not limited to, sensing, reading, detecting, measuring, probing, discovering, discriminating, checking, examining, and determining.

In an embodiment, MCU 112 executes instructions to control data latch processor 192 to determine a data state (e.g., S0-S7 in FIG. 4) of memory cells. The data state may be defined by a range of some physical parameter including, but not limited to, transistor threshold voltage, resistance, or current. Thus, to determine a data state means to determine what range of a certain physical parameter a memory cell is in.

In an embodiment, MCU 112 executes instructions to control data latch processor 192 to determine whether a memory cell conducts a current in response to voltages applied to the memory cell. In an embodiment, MCU 112 executes instructions to control data latch processor 192 to determine whether the threshold voltage of a memory cell is above or below a reference voltage (e.g., Vr1-Vr7; or Vv1-Vv7 in FIG. 4) applied to the memory cell.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because microcontroller 112 receiving the wired-OR can determine when all bits being programmed have reached the desired level.

For example, when each bit has reached its desired level, a logic zero for that bit will be sent to the wired-OR line (or a data one is inverted). When all bits output a data 0 (or a data one inverted), then microcontroller 112 knows to terminate the programming process. Because each processor communicates with four sense modules, microcontroller 112 needs to read the wired-OR line four times, or logic is added to data latch processor 192 to accumulate the results of the associated bit lines such that microcontroller 112 need only read the wired-OR line one time. Similarly, by choosing the logic levels correctly, microcontroller 112 can detect when the first bit changes its state and change the algorithms accordingly.

During program or verify operations, the data to be programmed (write data) are stored in data latches 194 from lines 118, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of microcontroller 112, comprises a series of programming voltage pulses applied to the control gates of the addressed memory cells. Each programming voltage is followed by a read back (verify test) to determine if the memory cell has been programmed to the desired memory state.

In some cases, data latch processor 192 monitors the read back memory state relative to the desired memory state. When the two states agree, data latch processor 192 sets the bit line latch to cause the bit line to be pulled to a state designating program inhibit (e.g., 2-3V). This inhibits the memory cell coupled to the bit line from further programming even if programming voltages appear on its control gate. In other embodiments, data latch processor 192 initially loads the bit line latch, and the sense circuitry sets the bit line latch to an inhibit value during the verify process.

Each set of data latches 194 may be implemented as a stack of data latches for each sense module. In some implementations, the data latches are implemented as a shift register so that the parallel data stored therein is converted to serial data for lines 118, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2 is a block diagram of example memory system 100, depicting more details of one embodiment of controller 122. In an embodiment, controller 122 is a flash memory controller. Non-volatile memory 108 is not limited to flash memory technology. Thus, controller 122 is not limited to the example of a flash memory controller. As used herein, a flash memory controller is a device that manages data stored in flash memory and communicates with a host, such as a computer or electronic device. A flash memory controller can have various functionality in addition to the specific functionality described herein. For example, a flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features.

In operation, when a host needs to read data from or write data to the flash memory, the host will communicate with the flash memory controller. If the host provides a logical address to which data are to be read/written, the flash memory controller can convert the logical address received from the host to a physical address in the flash memory. (Alternatively, the host can provide the physical address). The flash memory controller also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example.

For example, each module may include an ASIC, an FPGA, a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e., RAM, ROM, processor, interface).

Referring again to modules of controller 122, a buffer management/bus control 214 manages buffers in random access memory (RAM) 216 and controls the internal bus arbitration of controller 122. A read only memory (ROM) 218 stores system boot code. Although illustrated in FIG. 2 as located separately from controller 122, in other embodiments one or both of the RAM 216 and ROM 218 may be located within controller 122. In yet other embodiments, portions of RAM and ROM may be located both within controller 122 and outside controller 122. Further, in some implementations, controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. Host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one more extra die as implied by the common name, but RAID parity also may be added within the existing die, e.g., as an extra plane, or extra block, or extra WLs within a block.

A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of physical layer interface 222, RAID module 228, media management layer 238 and buffer management/bus controller 214 are optional components that are not necessary in controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, MML 238 may include an algorithm in the memory device firmware which translates writes from the host into writes to memory structure 126 of die 108. MML 238 may be needed because memory structure 126: 1) may have limited endurance; 2) may only be written in multiples of pages; and/or 3) may not be written unless it is erased as a block.

MML 238 understands these potential limitations of memory structure 126 which may not be visible to the host. Accordingly, MML 238 attempts to translate writes from host into writes into memory structure 126. As described below, erratic bits may be identified and recorded using MML 238. This recording of erratic bits can be used for evaluating the health of blocks and/or word lines (the memory cells on the word lines).

Controller 122 may interface with one or more memory die 108. In one embodiment, controller 122 and multiple memory die (together comprising non-volatile storage system 100) implement an SSD, which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a diagram that shows further details of one embodiment of circuits for applying voltages to a memory structure 126. Two blocks 300, 320 of memory cells are depicted. Circuits of FIG. 3 apply voltages to word lines and select lines. Microcontroller 112 provides control signals to the circuits, in one embodiment. For example, microcontroller 112 may issue control signals to one or more of CONTROL 380, High Voltage Generator (HV GEN) 372, Page Buffer Driver (PB DRV) 374, Command Register (CMD REG) 376 and Input/Output (I/O) Buffer 378. In an embodiment, microcontroller 112 issues control signals to CONTROL 380, which in turn controls other elements such as HV GEN 372 and PB DRV 374.

In an embodiment, HV GEN 372 is connected to word line driver 350, to control magnitudes and timing of voltages. PB DRV 374 is connected to page buffer 340 to control the page buffer 340. The page buffer 340 may include sense blocks, such as SB1 of FIG. 1B.

Each block of storage elements is associated with a set of transfer transistors, in one possible embodiment. For example, block 300, which is a selected block in this example, e.g., a block in which a programming or sense operation is to take place, includes a drain-side select gate (SGD) connected to a transfer transistor 304, a drain-side dummy word line (WLDD) connected to a transfer transistor 306, a word line (WL47) connected to a transfer transistor 308, intermediate word lines WL30-WL1 (not shown) connected to respective transfer transistors (not shown), a word line (WL0) connected to a transfer transistor 310, a source-side dummy word line (WLDS) connected to a transfer transistor 312, and a source-side select gate (SGS) connected to a transfer transistor 314.

The control gate of each transfer transistor of block 300 is connected to a block decoder (BD) 302 via a common path 303. The BD 302 receives a voltage from a transfer transistor driver (TT DRV) 364 and a control signal from an address register (ADD REG) 370. The control signal includes an address. If the address matches an address of the BD 302, BD 302 acts as a conductive switch which passes the voltage to the control gates of the associated transfer transistors via path 303. If the address does not match the address of BD 302, BD 302 acts as a non-conductive switch which does not pass the voltage to the control gates of the associated transfer transistors.

Each transfer transistor may be an n-channel MOSFET, for example, which has a drain node on the left hand side and a source node on the right hand side. The drain node for each transfer transistor is connected to a respective voltage driver in a set of high-voltage voltage drivers 350. Each driver may include an on-chip charge pump.

For example, the transfer transistor 304 is connected to a drain select gate driver (SGD DRV) 352, the transfer transistor 306 is connected to a dummy word line driver (WLDD DRV) 354, the transfer transistor 308 is connected to the word line driver (WL47 DRV) 356, . . . , the transfer transistor 310 is connected to the word line driver (WL0 DRV) 358, the transfer transistor 312 is connected to the source side dummy word line driver (WLDS DRV) 360, and the transfer transistor 314 is connected to the source select gate driver (SGS DRV). Each voltage driver can be independently controlled to provide a desired output voltage.

A similar arrangement is used for the example unselected block 320, which includes a transfer transistor 324 connected to SGD and SGD DRV 352, a transfer transistor 326 connected to WLDD and WLDD DRV 354, a transfer transistor 328 connected to WL47 and WL47 DRV 356, . . . , a transfer transistor 330 connected to WL0 and WL0 DRV 358, a transfer transistor 332 connected to WLDS and WLDS DRV 360, and a transfer transistor 334 connected to SGS and SGS DRV 362.

The control gates of the transfer transistors of unselected block 320 are connected to a respective block decoder (BD) 322 via a common path 323. BD 322 also is connected to TT DRV 364 to receive a voltage, and to address register 370 to receive a control signal which instructs BD 322 to pass or not pass the voltage to the control gates of the associated transfer transistors via path 323. Address register (ADD REG) 370 also communicates with the voltage drivers in the set of high-voltage voltage drivers 350.

A number of bit lines (BLs) 342 extend across the selected block 300 and the unselected block 320 (and across additional unselected blocks, not shown, in some implementations) and into a page buffer 340, which is responsive to column decoder 132. Page buffer 340 stores data which are written into, or read from, a selected word line of the selected block.

During an operation of the memory device, address register 370 provides a data load command to an input-output buffer 378 and to a command register 376. Input-output buffer 378 provides the command to page buffer 340. Command register 376 provides a command to a control circuit 380, which instructs a high voltage generator 372 to control voltage drivers 350 at appropriate levels.

Typically, during programming, the driver of the selected word line provides a programming level voltage, such as 12-26 V and the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. Control 380 also instructs the page buffer driver (PB DRV) 374 to control page buffer 340. Address register 370 also communicates with column decoder 132.

Figure 4:
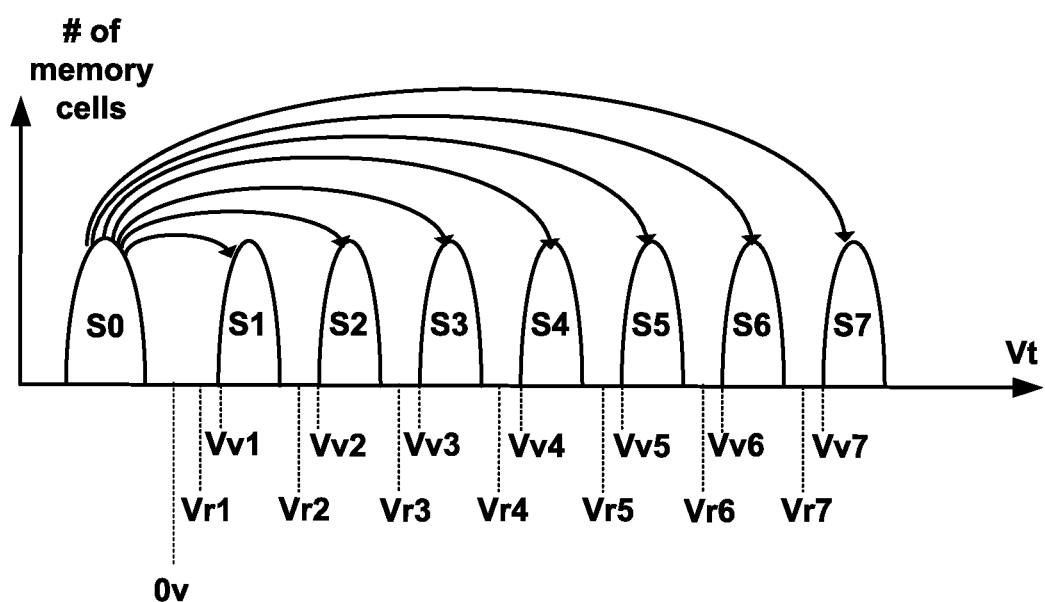
FIG. 4 depicts threshold voltage distributions.

The memory systems discussed above can be erased, programmed/written and read. At the end of a successful programming process (with verification), the threshold voltages of the memory cells should be within one or more distributions of threshold voltages for programmed memory cells or within a distribution of threshold voltages for erased memory cells, as appropriate. FIG. 4 illustrates example threshold voltage distributions for the memory cell array when each memory cell stores three bits of data. Other embodiments, however, may use other data capacities per memory cell (e.g., such as one, two, four, or five bits of data per memory cell).

FIG. 4 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, also are called programmed states. Each threshold voltage distribution (data state) corresponds to predetermined values for the set of data bits.

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (e.g., S0, S, S2, S3, . . . ) a memory cell is in.

FIG. 4 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7.

For example, while some memory cells are being programmed from data state S0 to data state S1, other memory cells are being programmed from data state S0 to data state S2 and/or from data state S0 to data state S3, and so on. The arrows of FIG. 4 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

In one embodiment, when a block is subjected to an erase operation, all memory cells are moved to data state S0, the erased state. The proposed technology described herein can be used for embodiments in which each memory cell stores one bit of data per memory cell (also referred to as SLC) and for embodiments in which each memory cell stores multiple bits of data per memory cell (FIG. 4). When memory cells store one bit of data per memory cell, there may be two data states. When memory cells store two bits of data per memory cell, there may be four data states.

Figure 5:
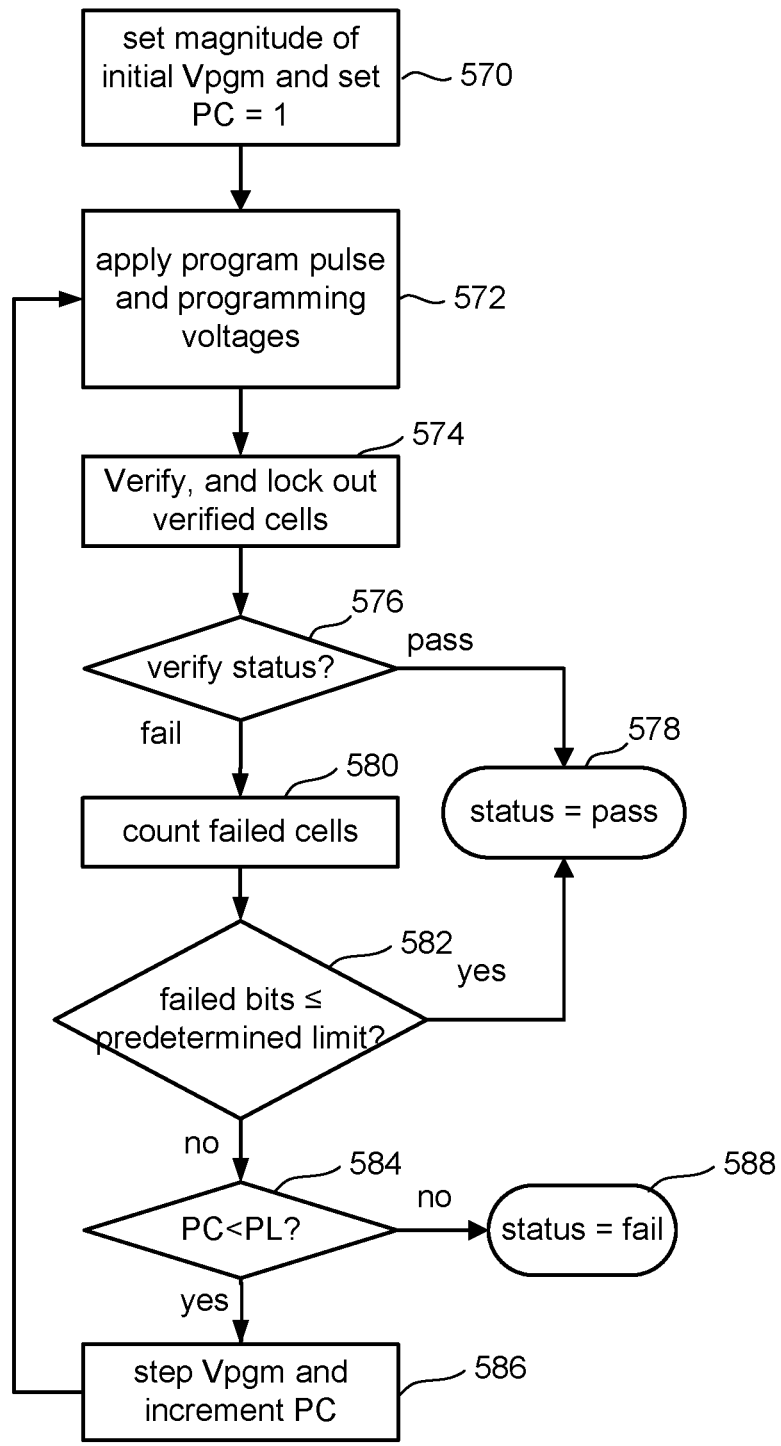
FIG. 5 is a flow chart describing one embodiment of a process for programming/writing data into memory cells connected to a common word line.

FIG. 5 is a flowchart describing one embodiment of a process for programming. In one example embodiment, the process of FIG. 5 is performed on memory die 108 using the one or more control circuits discussed above (see FIG. 1), at the direction of microcontroller 112. The process of FIG. 5 also can be used to implement the full sequence programming discussed above. The process of FIG. 5 also can be used to implement each phase of a multi-phase programming process. Additionally, the process of FIG. 5 can be used to program memory cells connected to the same word line with one bit of data per memory cell.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 570 of FIG. 5, the programming voltage (Vpgm) is initialized to the starting magnitude (e.g., ~12-16V or another suitable level) and a program counter PC maintained by microcontroller 112 is initialized at 1.

In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming.

In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target data states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by microcontroller 112, controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 588. This is one example of a program fault.

If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 586, the process loops back to step 572 and another program pulse is applied to the selected word line so that another iteration (steps 572-586) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g., see verify reference voltages Vv1, Vv2, Vv3, Vv4, Vv5, Vv6, and Vv7 of FIG. 4) to determine whether a threshold voltage of the concerned memory cell has reached such level. After applying the word line voltage, the conduction current of the memory cell is measured to determine whether the memory cell turned on (conducted current) in response to the voltage applied to the word line.

If the conduction current is measured to be greater than a certain value, then it is assumed that the memory cell turned ON and the voltage applied to the word line is greater than the threshold voltage of the memory cell. If the conduction current is not measured to be greater than the certain value, then it is assumed that the memory cell did not turn ON and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Step 572 of FIG. 5 includes applying a program voltage pulse on the selected word line. Step 574 of FIG. 5 includes verification, which in some embodiments comprises applying the verify reference voltages on the selected word line. As steps 572 and 574 are part of an iterative loop, the program voltage is applied as a series of voltage pulses that step up in magnitude. Between voltage pulses, verify reference voltages are applied.

Figure 6:
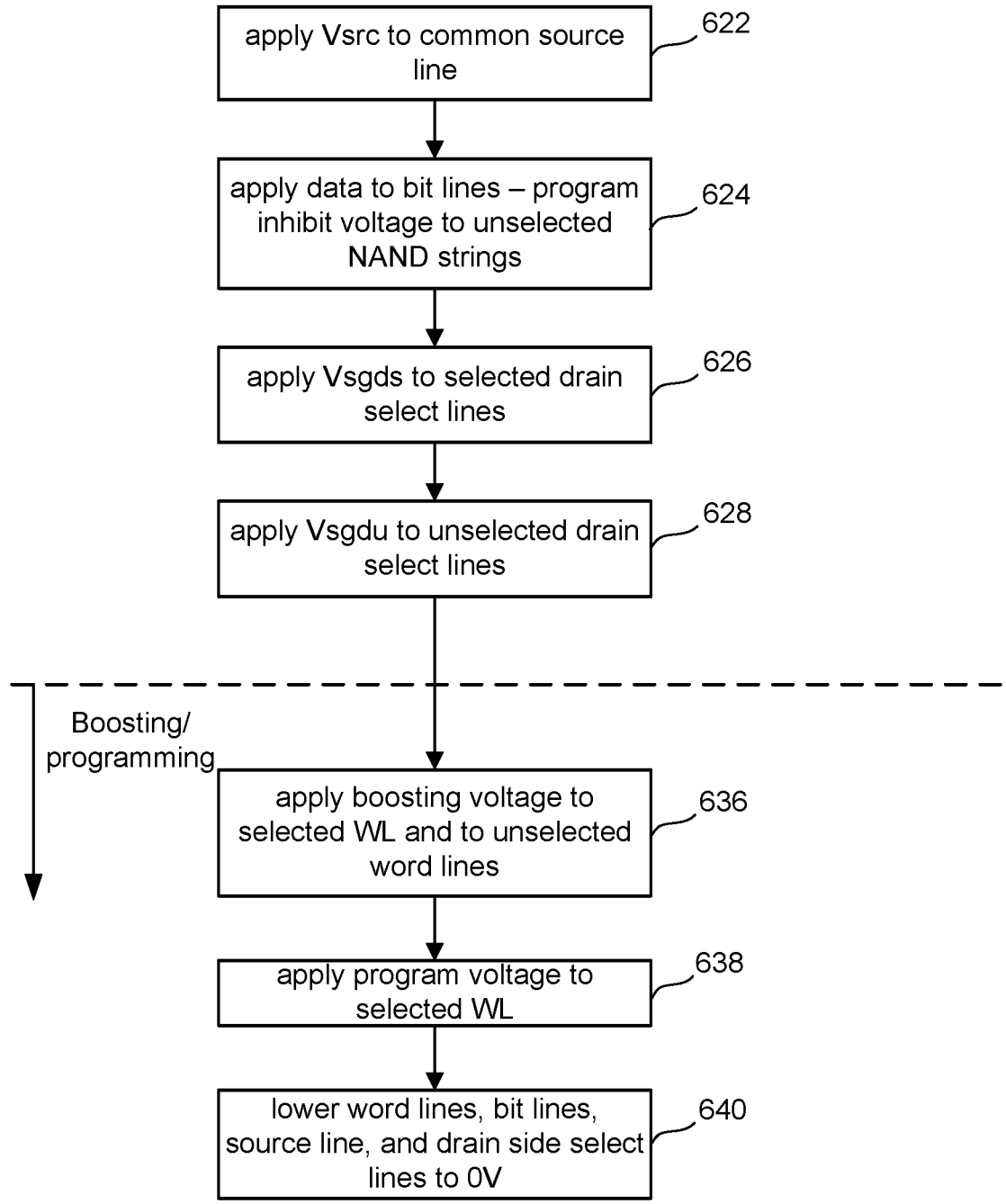
FIG. 6 is a flowchart of one embodiment details of programming non-volatile storage during step 572 of FIG. 5.

FIG. 6 is a flowchart of one embodiment of applying a program pulse and programming voltages that may be used in step 572 of FIG. 5. This process is used to program 3D NAND in one embodiment. FIG. 6 shows timing of various signals during one embodiment of the process of FIG. 6. The MCU 112 controls the timing and magnitudes of the signals in FIG. 6, in one embodiment. Note that the various signals in FIG. 6 are just one example of voltages applied to the memory structure 126 during a memory operation. The timing of the signals in FIG. 6 is controlled by CTC signals, in an embodiment.

A low voltage is applied to the source line at step 622. Referring to FIG. 6, the common source line SL is raised to a low voltage Vsrc (e.g., about 1.0V-1.5V) at time t0 where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 6 are at 0V at time t0.

At step 624, the data is applied to the bit lines. The data may be applied to the bit lines based on whether a memory cell in the NAND strings that are in the present programming operation is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Referring to FIG. 6, line 1152 shows the bit line voltage at 0V for a NAND string (in the set that are a part of the present programming operation) having a memory cell at the selected word line WLn that is to be programmed. Line 1150 shows the bit line voltage at VDD for a NAND string (in the set that are a part of the present programming operation) having a cell at WLn that is to be inhibited from programming. VDD designates program inhibit and is often referred to as a program inhibit voltage. Note that line 1152 represents one example of V_Program_Enable, and that line 1150 represents one example of Vbl_Inhibit.

Step 626 is to apply Vsgds to selected drain side select lines. Step 628 is to apply Vsgdu to unselected drain side select lines. Note that FIG. 6 shows two SGD lines. Line SGDs refers to a drain side select line having at least one NAND string that is currently programming. Line SGDu refers to a drain side select line having no NAND strings currently programming.

Referring to FIG. 6, at time t3, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time t3.

Note that at this time Vsgds may also be applied to control gates of drain side select transistors of NAND strings for which no memory cell should be programmed. However, note that Vbl_Inhibit is being applied to the unselected bit line BL1 at time t3.

Referring again to FIG. 6, at time t3, drain side select line SGDu is set to Vsgdu. The voltage Vsgdu should keep off the associated drain side select transistor.

At step 636, a boosting voltage (e.g., $V_{PASS}$) is applied to unselected word lines. Note that the magnitude for VPASS does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 6, at time $t_4$, the boosting/programming phase begins. The boosting voltages are applied to the various word lines at time $t_4$. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 8 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 638. With the boosting voltages applied and the inhibited NAND string channels boosted, program disturb of unselected memory cells on the selected word line is prevented or reduced.

Figure 7:
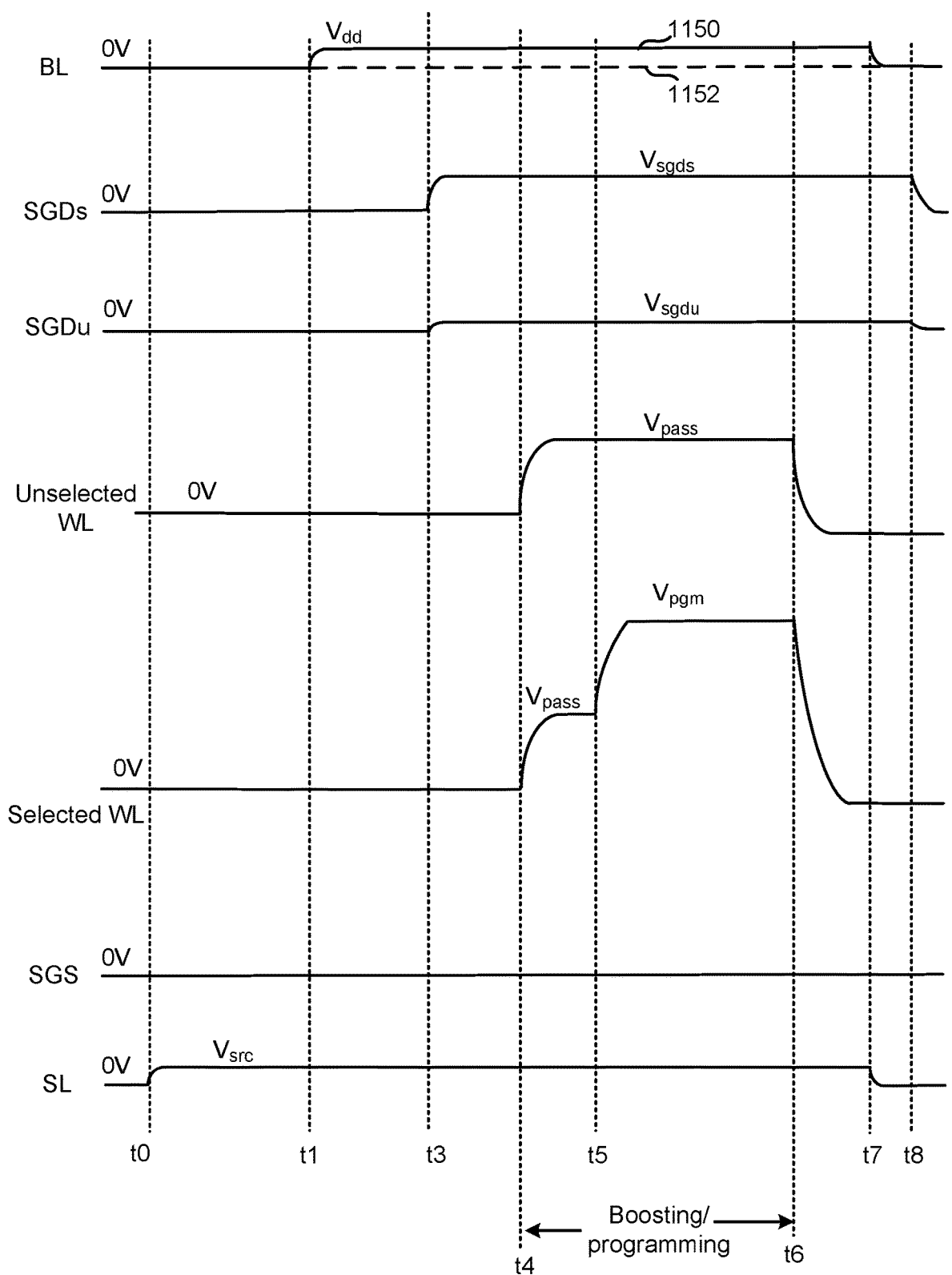
FIG. 7 shows timing of various signals during one embodiment of the process of FIG. 6.

Referring to FIG. 7, at time t5, the program voltage VPGM is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 640, the word lines, bit lines, source lines, and drain select lines are lowered to 0V, marking the completion of one programming iteration. It should be noted that the steps of FIG. 6 can be applied with each iteration of the process of FIG. 5, with the program voltage being increased each iteration. However, it is not required that the program voltage increase in magnitude with each iteration.

Referring to FIG. 7, at time t6, the word lines are lowered to 0V. The source and bit lines are then lowered to 0V at time t7. The drain select line SGD is lowered to 0V at time t8.

Numerous variations to the signals depicted in FIG. 7 can be made in accordance with embodiments. Also note that timing and/or magnitudes of the voltages in FIG. 7 (as well as other memory array signals) can be modified by modifying instructions executed by the MCU 112. For example, if it is determined that the length of time for which the programming voltage is applied should be changed, then the instructions can be modified to change the length of time between t5 and t6 in FIG. 7. In one embodiment, this change is made by changing the timing of setting/resetting CTC signals, which in turn control the timing of the voltages in FIG. 7. Many other modifications to memory array voltages can be made by modifying instructions executed by the MCU 112 and/or by modifying data that the MCU 112 uses to execute the instructions.

Figure 8:
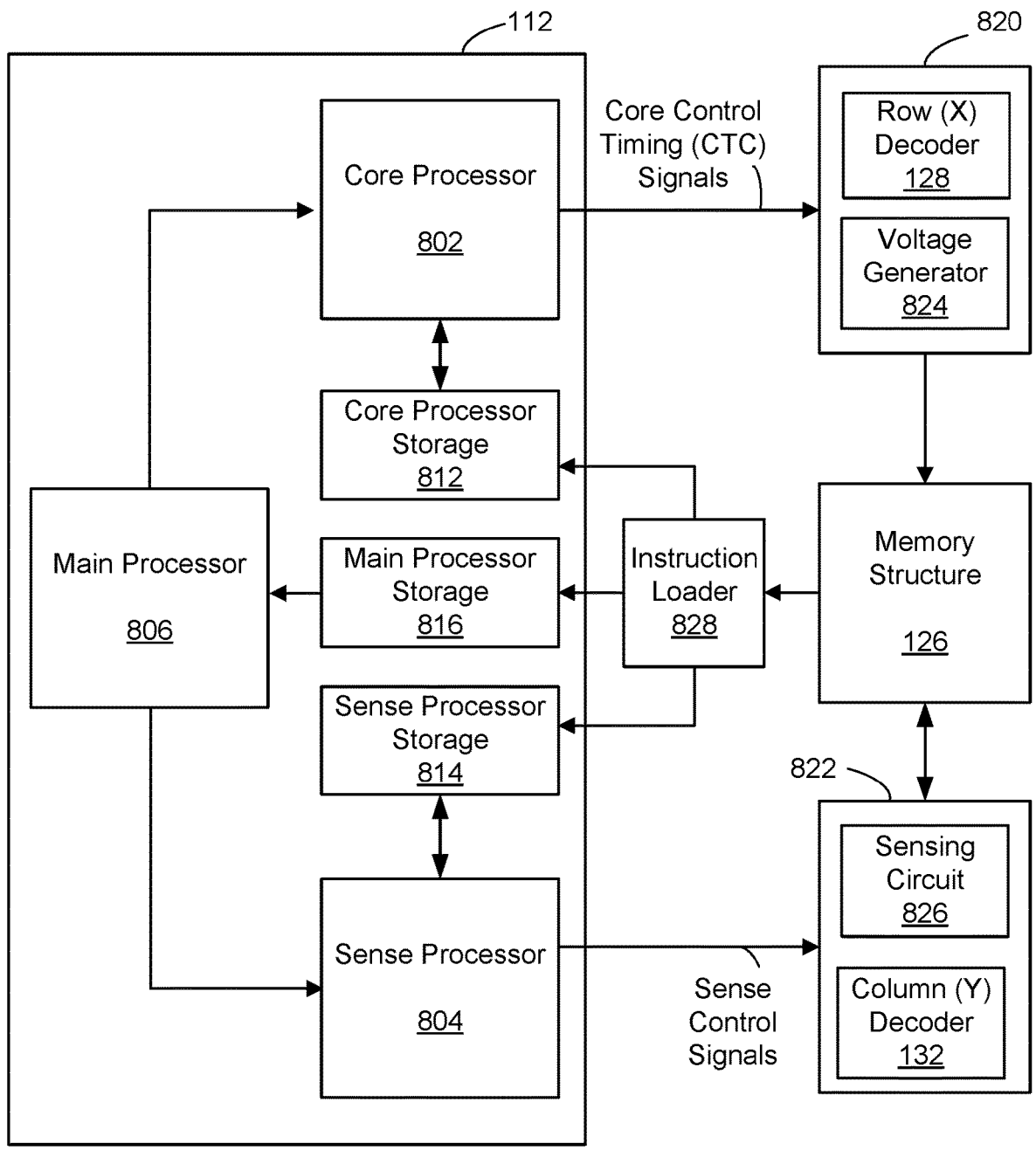
FIG. 8 is a high-level block diagram of one embodiment of a microcontroller, having three processors, and other elements.

FIG. 8 is a high-level block diagram of one embodiment of microcontroller 112, and other elements. The other elements include a memory structure 126, which contains non-volatile memory cells, first circuit 820, and second circuit 822. Microcontroller 112 provides on-die control for reading, programming, and erasing the non-volatile memory cells of memory structure 126. Additionally, microcontroller 112 provides on-die control for interfacing with controller 122.

The first circuit 820 includes a voltage generator 824 and row decoder 124. The first circuit 820 is configured to apply voltages to the memory structure 126. This may include voltages to one or more of word lines, select lines (e.g., SGD, SGS), source lines, as well as other elements in the memory structure 126. The first circuit 820 may include decoders (e.g., row decoder 124) and charge pumps, which provide the voltages for word lines, select lines (e.g., SGD, SGS), source lines, as well as other elements in the memory structure 126. The first circuit 820 may include power control circuit 116 and/or on-chip address decoder 114. In one embodiment, the first circuit 820 includes one or more of the elements in FIG. 3 that are connected to the blocks 300, 320. For example, the voltage generator 824 may include high-voltage voltage drivers 350 (each driver may include an on-chip charge pump). The row decoder 124 may include one or more of block decoder (BD) 322, transfer transistors 304-314, 324-334. The first circuit 820 may include other elements from FIG. 3 such as CONTROL 380, HV GEN 372, CMD REG 376, and/or ADD REG 370. Note that the first circuit 820 is not limited to the embodiment depicted in FIG. 3.

The second circuit 822 is configured to test conditions of the non-volatile memory cells in response to the voltages applied to the memory structure 126. The second circuit 822 includes sensing circuit 826 and column decoders 132. The sensing circuit 826 may include and control sense amplifiers that sense a current of a memory cell.

In one embodiment, the sensing circuit 826 includes all or a portion of a sense block (see, for example, SB1 in FIG. 1B). For example, sensing circuit 826 may include sense modules (e.g., SM0, SM1, SM2, SM3) and data latches (e.g., latches 194). In one embodiment, sensing circuit 826 includes data latch processor 192 (see FIG. 1B). In one embodiment, data latch processor 192 tests conditions of the non-volatile memory cells in response to the voltages applied to the memory structure 126. The second circuit 822 may include one or more managing circuits (e.g., MC0, FIG. 1B). It is not required that the sensing circuit 826 include all of the elements in the MC0 depicted in FIG. 1B. Also, the sensing circuit 826 may include elements not depicted in MC0 of FIG. 1B. In one embodiment, the second circuit 822 includes page buffer 340, PB DRV 374, and I/O 378 (see, FIG. 3). Note that CONTROL 380 may be shared between the first circuit 820 and the second circuit 822.

The microcontroller 112 includes a core processor 802 a sense processor 804, and a main processor 806. The core processor 802 sends control signals to the first circuit 820. The control signals could be analog or digital signals. The control signals may be sent over a communication medium. A communication medium may comprise one or more signal lines. A signal line is capable of transmitting an electrical signal, such as a voltage level, in some embodiments. For example, a signal line may be an electrically conductive path. A signal line is capable of transmitting an electromagnetic signal, such as an optical signal (e.g., light pulse), in some embodiments. For example, a signal line may comprise an optical waveguide. In embodiments, a signal line may include, but is not limited to, one or more of a wire, trace, transmission line, track, pad, layer, lead, metal, portion of a printed circuit board or assembly, conducting material and other material that may transfer or carry an electrical signal, and/or electromagnetic signal. In embodiments, a signal line may form one or more geometric shapes, such as a line or multiple connected lines. In embodiments, a signal line may be unidirectional or bidirectional in transferring signals between circuits and within circuits. Note that the communication medium may comprise elements other than the signal lines, such as drivers, buffers, or logic gates.

The core processor 802 is configured to control the first circuit 820 to control analog voltages (e.g., word line voltages, select line voltages, etc.) applied by the first circuit 820 to the memory structure 126, in one embodiment. The core processor 802 is configured to control decoders and charge pumps in the first circuit 820, in one embodiment. The core processor 802 is configured to control voltage levels applied by sense amplifiers, in one embodiment. Note that throughout this description, the phrase, "a processor is configured to control a circuit" or the like, does not require that the processor control all functionality of the circuit.

Note that the timing of the sequences of voltages applied by the first circuit 820 in order to program, read, or erase memory cells may be very complex. In some embodiments, a core timing chart specifies the timing of the sequences of CTC signals that are used to control the voltages applied by the first circuit 820. FIG. 7 shows one example of timing of the sequences of voltages applied during a programming operation. The core processor 802 is configured to issue CTC signals for different memory operations, in one embodiment. Thus, the core processor 802 may be configured to execute first instructions to coordinate sequences of voltages applied to the memory structure 126 by the first circuit 820 in order to perform memory operations with respect to non-volatile memory cells in the memory structure 126. The memory operations could be, for example, read, program, and/or erase operations. The core processor 802 may also be referred to as a core machine (CM).

The sense processor 804 sends control signals to the second circuit 822. The control signals could be analog or digital signals. The control signals may be sent over a communication medium. As noted above, a communication medium may comprise one or more signal lines, and may also comprise drivers, buffers, and/or logic gates. The sense processor 804 is configured to execute second instructions to control the second circuit 822 to test conditions of the non-volatile memory cells in response to the voltages applied to the memory structure 126. The manner in which the conditions may be tested may include, but is not limited to, sensing, reading, detecting, measuring, probing, discovering, discriminating, checking, examining, and determining. For example, the sense processor may control the second circuit 822 to determine a data state of the non-volatile memory cells. In one embodiment, the sense processor 804 sends control signals to data latch processor 192 (see FIG. 1B).

In one embodiment, the sense processor 804 controls the sensing circuit 826 to test conditions of non-volatile memory cells in memory structure 126 in response to voltages applied to the memory structure 126 (such as reference voltages applied to the non-volatile memory cells) by the voltage generator 824. The condition of a non-volatile memory cell can be any physical parameter of a non-volatile memory cell. In one embodiment, the sense processor 804 controls the sensing circuit 826 to determine a data state (e.g., S0-S7 in FIG. 4) of memory cells. In one embodiment, the sense processor 804 controls the sensing circuit 826 to determine whether a memory cell conducts a current in response to voltages applied to the memory cell by the voltage generator 824. In one embodiment, the sense processor 804 controls the sensing circuit 826 to determine whether the threshold voltage of a memory cell is above or below a reference voltage (e.g., Vr1-Vr7; Vv1-Vv7 in FIG. 4) applied to the memory cell.

For example, with reference to FIG. 4, the sense processor 804 may control the second circuit 822 to determine which of the data states (e.g., S0-S7) each of a set of memory cells is in. In one embodiment, the sense processor 804 controls the second circuit 822 to test whether selected memory cells have a threshold voltage above or below a reference voltage applied by the power control circuit 116. The reference voltage might be one of Vr1-Vr7, with reference to FIG. 4, in the event that a read operation is being performed. The reference voltage might be one of Vv1-Vv7, with reference to FIG. 4, in the event that a program verify operation is being performed. The Sense Processor may alternatively be referred to as a Y processor (YP) or Y machine (YM) due to the association between sensing and the Y-decoder 132, in some embodiments. In one embodiment, the sense processor 804 executes instructions in the second processor storage 814 in response to a trigger signal from the core processor 802. This allows the core processor 802 to control the timing of sensing operations relative to the timing of voltages applied to the memory structure 126 by the first circuit 820. Stated another way, this allows the activities (e.g., sensing) of the second circuit 822 to be coordinated with the activities (e.g., applying voltages to the memory structure 126) of the first circuit 820. For example, during a sensing operation, the core processor 802 can control the first circuit 820 to establish appropriate voltage levels applied to memory cells; then, after appropriate voltage levels are applied to memory cells, the core processor 802 can trigger the sense processor 804 to initiate a sensing operation (by the sense processor 804 controlling the second circuit 822). The trigger signal may be an analog or digital signal. In one embodiment, the trigger signal has two states: logical high (which triggers the sense processor) and logical low (which does not trigger the sense processor).

The core processor storage 812, the sense processor storage 814, and the main processor storage 816 are tangible, non-transitory storage. The non-transitory storage could be volatile or non-volatile. The core processor storage 812 is used to store first instructions that are executed by the core processor 802. The core processor storage 812 may also be used to store parameters that the core processor 802 applies when executing the first instructions. The sense processor storage 814 is used to store second instructions that are executed by the sense processor 804. The sense processor storage 814 may also be used to store parameters that the sense processor 804 applies when executing the second instructions. The main processor storage 816 is used to store third instructions that are executed by the main processor 806. The main processor storage 816 may also be used to store parameters that the main processor 806 applies when executing the third instructions. The MCU 112 may have other processors, such as a parameter processor that control various memory operation parameters.

In one embodiment, a copy of the first instructions (and possibly parameters used by core processor 802), a copy of the second instructions (and possibly parameters used by sense processor 804), and a copy of the third instructions (and possibly parameters used by main processor 806) are stored in non-volatile storage in order to persist the instructions (and possibly parameters) across power cycles. Those copies may be loaded into a volatile storage, which is accessed by the respective processors 802, 804, 806. For example, the instruction loader 828 may load a copy of the instructions (and possibly parameters) from the memory structure 126 into the core processor storage 812, the sense processor storage 814, and the main processor storage 816. Note that although the core processor storage 812, the sense processor storage 814 and the main processor storage 816 are depicted as within the microcontroller 112, the core processor storage 812, the sense processor storage 814 and/or the main processor storage 816 may reside outside of the microcontroller 112.

Note that the instructions and/or parameters in the core processor storage 812, the instructions and/or parameters in the sense processor storage 814 and/or the instructions and/or parameters in the main processor storage 816 can be modified to allow the operation of the core processor 802 and/or sense processor 804 and/or main processor 806 to be modified. For example, the instructions which the core processor 802 executes could be modified to change the timing of applying voltages to the memory structure 126. In one embodiment, the instructions are modified to change when CTC signals are set/reset in order to change the timing of applying voltages to the memory structure 126.

The core processor 802, the sense processor 804, and the main processor 806 are able to fetch, decode, and execute instructions from their respective processor storage (812, 814, 816), in one embodiment. The core processor 802, the sense processor 804 and the main processor 806 can be implemented as microprocessors, in one embodiment. A microcontroller 112 may comprise one or more processors that process and/or execute microcode or other computer executable code (e.g., an instruction set) to perform tasks or operations. The core processor 802, the sense processor 804 and the main processor 806 may each comprise elements such as of flip flops, latches, RAM/ROM, combinational logic, etc. In one embodiment, the core processor 802, the sense processor 804 and the main processor 806 are implemented using CMOS technology. The Microcontroller 112 is positioned on the substrate underneath the memory array, in one embodiment. The Microcontroller 112 resides on the same memory die as the memory structure 126, in one embodiment. The Microcontroller 112 resides on the same memory die as the memory structure 126, first circuit 820, and second circuit 822, in one embodiment.

The instruction loader 828 may take the form of packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each instruction loader 828 may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, instruction loader 828 may include or comprise software stored in a processor readable device (e.g., memory) to program a one or more processors to perform the functions described herein.

Figure 9:
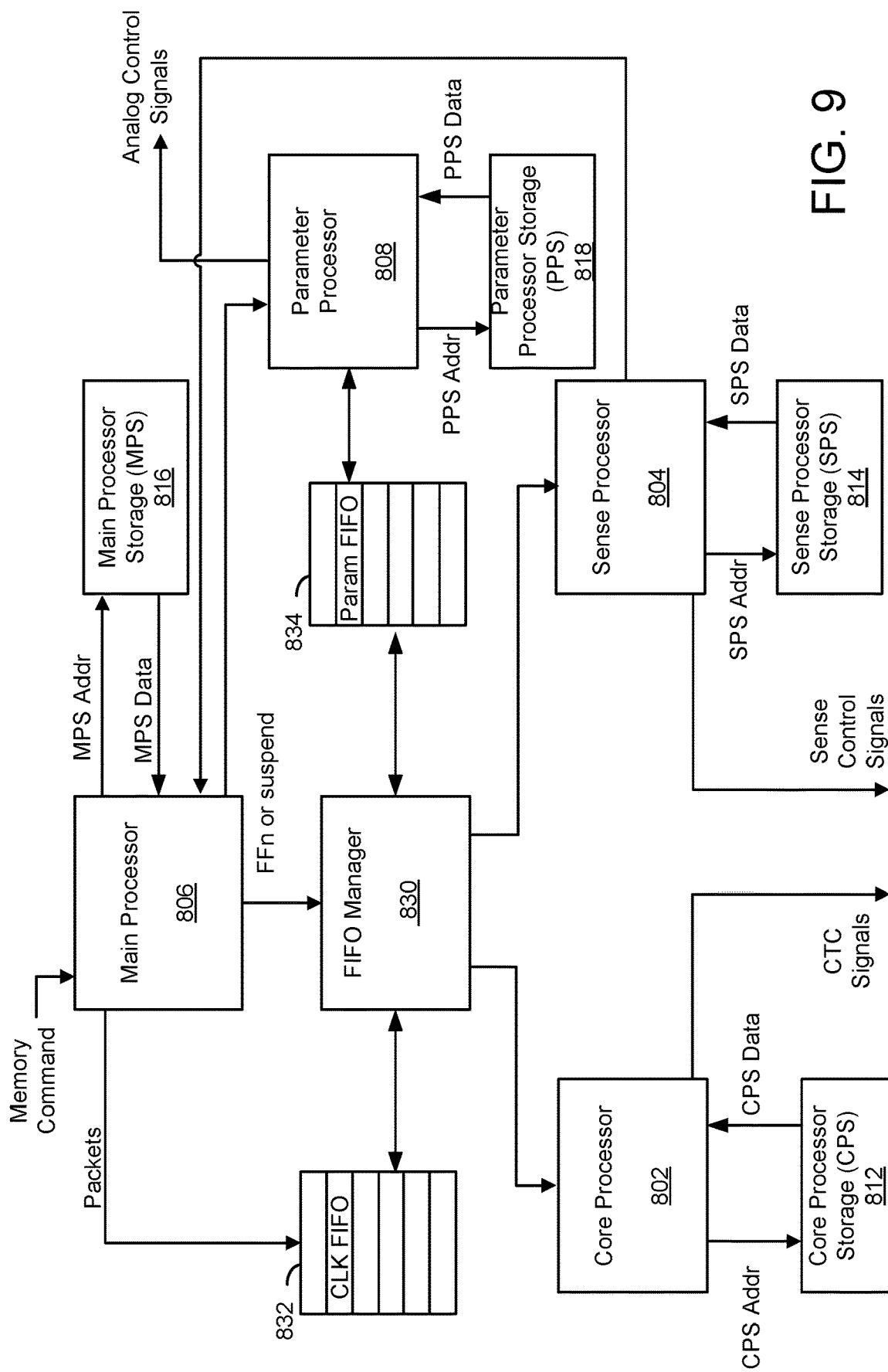
FIG. 9 is a block diagram of one embodiment of a microcontroller configured to issue core timing control (CTC) signals.

FIG. 9 is a block diagram of an embodiment of microcontroller 112 configured to issue CTC signals, as well as other signals to control memory array operations. FIG. 9 shows an embodiment in which microcontroller 112 includes Main Processor 806, Core Processor 802, Sense Processor 804, and Parameter Processor 808. The microcontroller 112 also has Core Processor Storage 812, Sense Processor Storage 814, Main Processor (MP) Storage 816, Parameter Processor Storage 818, CLK FIFO queue 832, param FIFO queue 834, and FIFO Manager 830.

The Main Processor Storage 816, Core Processor Storage 812, Sense Processor Storage 814, Parameter Processor Storage 818, CLK FIFO queue 832, and param FIFO queue 834 comprise tangible, non-transitory storage. The non-transitory storage could be volatile or non-volatile. In an embodiment, Main Processor Storage 816, Core Processor Storage 812, Sense Processor Storage 814, and Parameter Processor Storage 818 may include volatile memory (e.g., SRAM) that is loaded from memory structure 126 at power-on. For example, Core Processor Storage 812 gets loaded with a set of instructions for Core Processor 806, Sense Processor Storage 814 gets loaded with a set of instructions for Sense Processor 804, Main Processor Storage 816 gets loaded with a set of instructions for Main Processor 806, and Parameter Processor Storage 818 gets loaded with a set of instructions for Parameter Processor 808. Information other than instructions (e.g., parameters) also may be loaded with one or more of the sets of instructions.

In an embodiment, one or more of Core Processor Storage 812, Sense Processor Storage 814, Main Processor Storage 816 and/or Parameter Processor Storage 818 may include non-volatile memory, such that loading from memory structure 126 at power-on is not required. In an embodiment, one or more of Core Processor Storage 812, Sense Processor Storage 814 Main Processor Storage 816 and/or Parameter Processor Storage 818 may include a combination of ROM and re-writeable RAM.

In an embodiment, Main Processor 806 receives (e.g., from controller 122) a memory command such as program, read, erase, etc. The arrow between "Memory Command" and Main Processor 806 represents a communication medium, in an embodiment. Note that the various other arrows in FIG. 9 also represent communication media, in an embodiment. As noted herein, a communication medium may include a signal line. The labels next to an arrow refer to the name of a signal that may be transferred over a signal line.

In an embodiment, Main Processor 806 accesses instructions from Main Processor Storage 816 to control execution of the memory command (e.g., by controlling Core Processor 802, Sense Processor 804, and/or Parameter Processor 808). In an embodiment, Main Processor 806 determines what set of instructions Main Processor 806 needs to execute for the memory command.

Likewise, in an embodiment, Main Processor Storage 816 may contain more than one set of instructions for a program operation, as there may be different modes of program operations (e.g., SLC, MLC, TLC etc.). Note that, as the terms are used herein, SLC refers to storing a single bit per memory cell, MLC refers to storing two bits per memory cell, and TLC refers to storing three bits per memory cell. In an embodiment, Main Processor 806 determines the addresses for the set of instructions Main Processor 806 needs to execute for the memory operation, and accesses instructions at those addresses. Thus, Main Processor 806 may send the addresses (MPS Addr) to Main Processor Storage 816, which responds by returning the instructions (MPS Data). In an embodiment, Main Processor 806 also may access parameters from Main Processor Storage 816.

In an embodiment, Core Processor 802 may output a set of CTC Signals in response to executing instructions from the Core Processor Storage 812. For example, Core Processor 802 may output a set of CTC signals to first circuit 820 (not shown in FIG. 9) for a memory array operation. These CTC Signals may control charge pumps, decoders, etc., to apply voltages to word lines, select lines, etc. These CTC Signals may control voltage generator 824. Note that a given memory array operation may include applying a sequence of voltages having different magnitudes to the same line (e.g., word line) as time progresses. For example, the magnitude of voltage applied to the selected word line can change during the memory array operation.

In an embodiment, Core Processor 802 may send addresses (CPS Addr) to Core Processor Storage 812, which responds by returning instructions (CPS Data). In an embodiment, Core Processor 802 also may access parameters from Core Processor Storage 812. "CPS Data" may include instructions that Core Processor 802 executes and parameters or the like used by Core Processor 802. In an embodiment, Core Processor 802 then executes this set of instructions to provide CTC Signals to first circuit 820 to coordinate sequences of voltages applied by first circuit 820 to memory structure 126 for a particular memory operation.

Sense Processor 804 is connected to Sense Processor Storage 814, FIFO manager 830, and Main Processor 806. In an embodiment, Sense Processor 804 executes an instruction (or set of second instructions) in Sense Processor Storage 814. In an embodiment, Sense Processor 804 may send addresses (SPS Addr) to Sense Processor Storage 814, which responds by returning instructions (SPS Data). In an embodiment, Sense Processor 804 also may access parameters from Sense Processor Storage 814. "SPS Data" may include instructions that Sense Processor 804 executes and parameters or the like used by Sense Processor 804. In an embodiment, Sense Processor 804 then executes this set of instructions to provide Sense Control Signals to second circuit 822 (not depicted in FIG. 9) to coordinate sequences of voltages applied by second circuit 822 to memory structure 126 for a particular memory operation.

Parameter Processor Storage 818 may be used to store mode related parameters, as well as mode related instructions. Example "modes" are SLC, MLC, TLC, etc. Depending on the mode, the voltage magnitude may be different. For example, the read reference voltages for SLC will be different than those for TLC (e.g., see FIG. 4). Thus, Parameter Processor Storage 818 may store various parameters that may vary depending on the mode. Parameter Processor Storage 818 may be used to store parameters for operation of a Digital to Analog Converter (DAC) in voltage generator 824. Parameter Processor Storage 818 may store parameters such as the step size (increment) in programming voltage from one program loop to the next. This may be used to calculate the increase in Vpgm in a programming process, such as in step 786 of the programming process of FIG. 5.

In an embodiment, Parameter Processor 808 may send addresses (PPS Addr) to Parameter Processor Storage 818, which responds by returning instructions (PPS Data). In an embodiment, Parameter Processor 808 also may access parameters from Parameter Processor Storage 818. "PPS Data" may include instructions that Parameter Processor 808 executes and parameters or the like used by Parameter Processor 808. In an embodiment, Parameter Processor 808 then executes this set of instructions to provide Analog Signals to the memory array. As one example, Analog Control Signals may be used to control at least some of the functionality of voltage generator 824. These Analog Control Signals may be used to specify magnitudes of analog voltages (e.g., programming voltages, read reference voltages). Analog Control Signals may themselves be analog or digital signals. Analog Control Signals may be sent over a communication medium, which may include one or more signal lines. The communication medium also may include one or more driver(s), buffer(s), and/or logic gate(s).

CLK FIFO 832 may be used to store packets that contain information for the Core Processor 802 and the Sense Processor 804 to execute instructions in order to generate CTC signals and sense control signals, respectively. The FIFO manager 830 is configured to manage the CLK FIFO 832. The FIFO manager 830 provides packets (or other information) from the CLK FIFO 832 to the Core Processor 802, such that the Core Processor 802 learns what instructions to access from Core Processor Storage 812. The FIFO manager 830 provides packets (or other information) from the CLK FIFO 832 to the Sense Processor 804, such that the Sense Processor 804 learns what instructions to access from Sense Processor Storage 814. The FIFO manager 830 is a finite state machine, in one embodiment. The FIFO manager 830 may be a logic block that contains no RAM or ROM. In one embodiment, the CLK FIFO 832 is the master to the core processor 802. In one embodiment, the CLK FIFO 832 is master to the sense processor 804.

Parameter FIFO 834 may be used to store packets that contain information for the Parameter Processor 808 to execute instructions in order to generate the Analog Control signals. The FIFO manager 830 is configured to manage the Parameter FIFO 834. The Parameter Processor 808 accesses packets (or other information) from the Parameter FIFO 834, such that the Parameter Processor 808 learns what instructions/data to access from Parameter Processor Storage 818.

In an embodiment, Main Processor 806 determines an algorithm flow for executing the memory command it receives (e.g., from controller 122). In an embodiment, based on the algorithm flow, Main Processor 806 determines the content of packets to place on CLK FIFO 832. In some embodiments, the Main Processor 806 contains combinational logic, a finite state machine, or the like to determine the content of some of the packets. In an embodiment, Main Processor 806 sends a packet to CLK FIFO 832 for each sub-clock. In an embodiment, a packet may contain a dynamic bit map that specifies conditions that are active for a memory operation. In one embodiment, the dynamic bit map specifies conditions that are presently met for a sub-clock of a memory operation. Depending on the memory operation, there may be several packets for a single memory operation. In an embodiment, a packet specifies a segment of a memory operation for which CTC signals are to be generated. The packet specifies a sub-clock in order to specify the segment, in an embodiment. In an embodiment, Main Processor 806 may issue a reset or suspend signal to the FIFO manager 830.

Figure 10A:
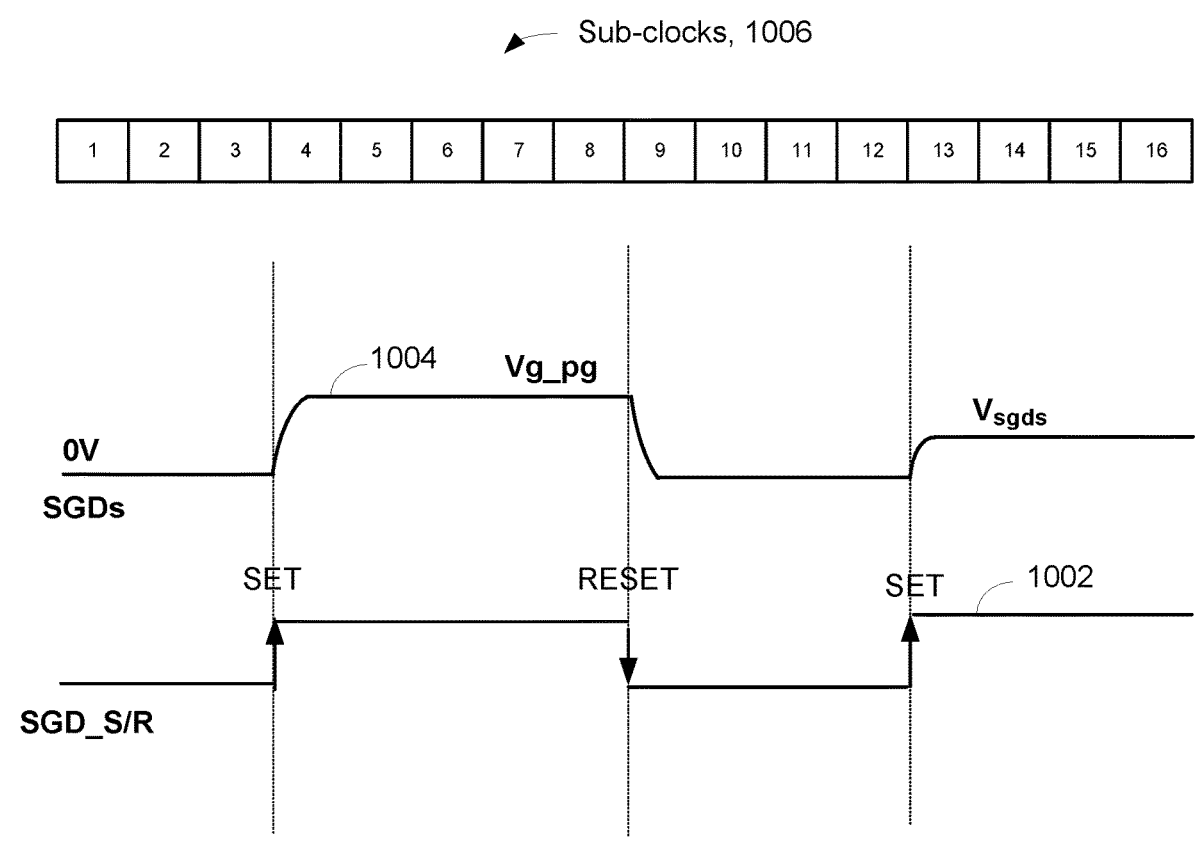
FIG. 10A is a diagram that shows how a CTC signal may be used to control a voltage waveform during an embodiment of a memory operation.

FIG. 10 is a diagram that shows how a CTC signal may be used to control a voltage waveform during an embodiment of a memory operation. A CTC signal 1002, referred to as SGD_S/R is used to control the voltage waveform 1004 referred to as SGDs. The timing is performed in relation to what are referred to herein as "sub-clocks" 1006. A sub-clock refers to a specific segment of a memory array operation. There 16 sub-clocks 1006 in the example in FIG. 10. The sub-clocks 1006 do not necessarily each have the same time duration. In this example, the CTC signal 1002 is SET during sub-clock 4, RESET during sub-clock 9, and SET during sub-clock 13. As a result, the voltage waveform 1004 transitions from a steady state value (e.g., 0V) to a level of Vg_pg at sub-clock 4, transitions back down to the steady state value at sub-clock 9, and transitions from the steady state value to Vsgds at sub-clock 13. In some embodiments, the magnitudes of Vg_pg and Vsgds are controlled by the Analog Signals from the parameter processor 808.

The CTC signal 1002 is one of many CTC signals that are issued to control different memory operations. In one embodiment, a specification describes the pulse shapes (e.g., start times, durations, magnitudes). This specification could cover waveforms such as the examples in FIG. 7 for a programming operation, as well as many other memory operations. From this specification, a combination of Excel macros and a script may be used to generate a set/reset (SR) table, which defines on what time and under what conditions each CTC signal needs to be set or reset. From this SR table, a master table may be generated.

FIG. 10B depicts one example of a portion of a master table 1050 for CTC signals. The column labeled "CTC signal" specifies the CTC signal for that row of master table 1050. A total of five different CTC signals are shown in the table, but typically there are many more CTC signals. For example, there could be more than 100 different CTC signals. In one embodiment, there are about 160 different CTC signals.

The mode column specifies the mode for the CTC signal for that row. In this example, the modes include program and read. There could be other modes such as verify and erase. The sub-mode column specifies the sub-mode for the CTC signal for that row. For the program mode, there is an "all bit line" (ABL) program mode, an SLC program mode, and an MLC program mode. There may be many other sub-modes for the program mode. For the read mode, there is an SLC read mode, and an MLC read mode. There may be many other sub-modes for the read mode.

The main clock column specifies the main clock for the CTC signal in that row. Two main clocks are shown (P_CLK for program, and R_CLK for read). It could take more than one main clock to complete a memory operation such as program or read. For example, the time frame for the voltage waveforms in FIG. 7 may correspond to a P_CLK. There may be additional main clocks needed to complete the program operation. In one embodiment, there are about 20 different main clocks.

The sub-clock column specifies the sub-clock for the CTC signal in that row. A sub-clock defines a segment of a memory operation. The sub-clocks do not necessarily last the same time. Hence, the segments may have different durations. A sub-clock is a portion of main clock, in one embodiment. For example, the time frame for the voltage waveforms in FIG. 7 may contain numerous different sub-clocks. As one example, each time (t0, t1, etc.) in FIG. 7 may correspond to a sub-clock. However, note that there may be additional sub-clocks to account for the need to change a voltage waveform not depicted in FIG. 7. As a further example, the time period in FIG. 10A may correspond to one main clock, which has 16 sub-clocks. Note that the sub-clocks in FIG. 10A may be given names such as p1, p2, etc. to distinguish over sub-clocks associated with other main clocks. In one embodiment, there are about 130 different sub-clocks.

The condition column specifies the dynamic condition under which the CTC signal in that row is to be set or reset during the sub-clock. The conditions are calculated based on a Boolean equation in one embodiment. The various letters (A, B, etc.) in the table 1050 pertain to various factors that indicate whether the dynamic condition is met for the sub-clock. For example, one of the factors might be whether a voltage (e.g., program voltage, boost voltage, kick voltage, read voltage, etc.) should be initiated or stopped. Another factor could be a mode of operation (e.g., SLC, MLC, ABL). There could potentially be hundreds, or even thousands of different conditions.

The Set/Reset column specifies whether the CTC signal in that row is to be set or reset during the sub-clock in response to the dynamic condition being met.

Figure 11:
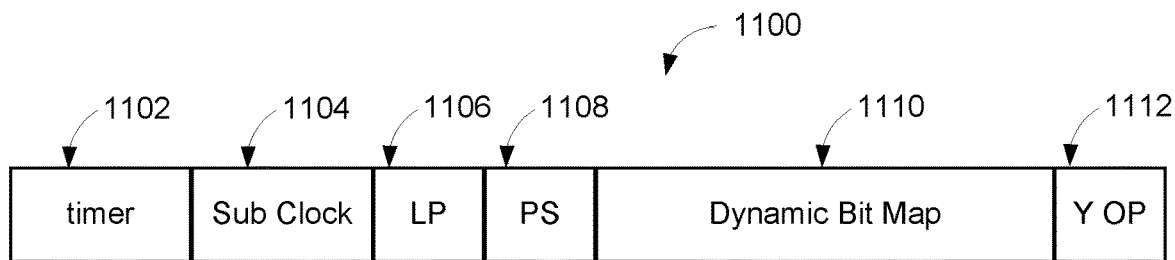
FIG. 11 illustrates an embodiment of a packet that contains information that may be used by the MCU to generate one or more CTC signals.

FIG. 11 illustrates an embodiment of a packet 1100 that contains information that may be used by the MCU 112 to generate one or more CTC signals. The packet 1100 is generated by the main processor 806, in an embodiment. The main processor 806 places the packet into CLK FIFO queue 832, in an embodiment. There may be multiple such packets for a single memory array operation, in an embodiment. For example, the core processor 802 may process multiple packets 1100 in order to generate the CTC signals for a write command (or read command, or erase command).

The packet 1100 contains a sub-clock field 1104, which contains a label for the sub-clock of the memory command. As noted above, a sub-clock refers to a segment of a memory command. The label is specified as a digital value, in an embodiment. A timer field 1102 specifies the number of clock cycles for the sub-clock.

Many sub-clocks only need a single packet. However, in some cases, more than one packet is used for a single sub-clock. A last packet (LP) field 1106 indicates whether this is the last packet in a multiple packet sequence for this sub-clock. This field 1106 may be a single bit.

A parameter machine (PM) field 1108 indicates whether the parameter processor 808 needs to refresh the parameter FIFO queue 834 output. Thus, note that a packet may be used to by the parameter processor 808, as well as the core processor 802.

Dynamic bit map 1110 is a bit map that specifies what conditions are met for this sub-clock. These conditions are referred to herein as "dynamic conditions," as the content of the dynamic bit map 1110 for each packet 1100 depends on conditions that are presently met, in an embodiment. The dynamic conditions are applicable to at least one CTC signal, in an embodiment. The CTC signals are divided into groups, in an embodiment. Thus, the dynamic conditions that are met for this sub-block are not necessarily applicable to each group of CTC signals. Details are described below for how to determine which of the conditions in the dynamic bit map are applicable to a group of CTC signals during the sub-clock specified in the packet. The main processor 806 determines what dynamic conditions are met for each sub-clock, in an embodiment.

Each bit in the dynamic bit map 1110 specifies a different condition, in an embodiment. In some cases, there may be more dynamic conditions for a sub-clock than there are bits in the dynamic bit map. In this case, more than one packet 1100 may be used to specify all of the dynamic conditions for this sub-clock. The last packet field is used to indicate whether or not there is another packet for the sub-clock. Note that there may be hundreds, or even thousands of possible dynamic conditions. Therefore, it will be appreciated that different dynamic conditions are being specified by the specific bits in the dynamic bit map for different sub-clocks.

The Y OP field 1112 contains control information for the Sense Processor 804. Thus, the packet 1100 may be used to control operation of the sense processor 804, in an embodiment.

Figure 12A:
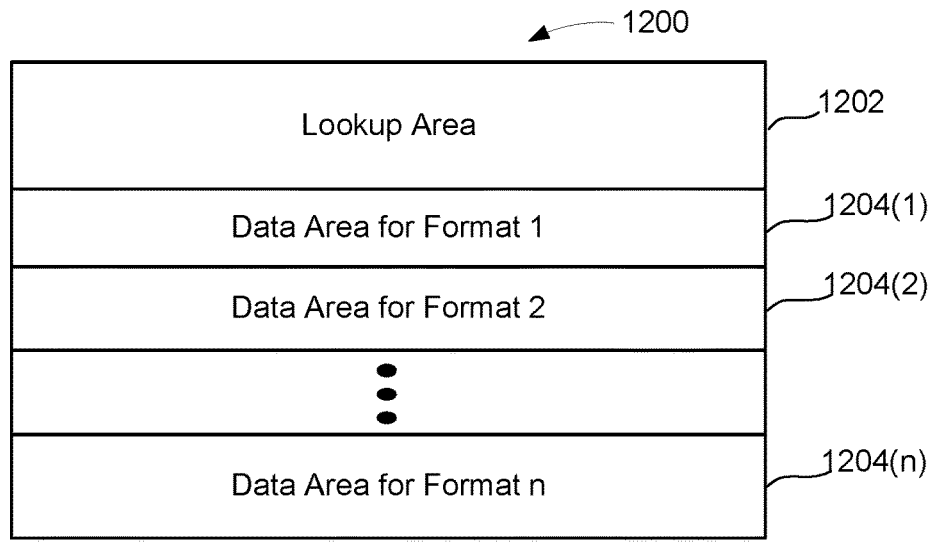
FIG. 12A illustrates an embodiment of data structures for looking up and/or computing CTC signals.

FIG. 12A illustrates an embodiment of data structures 1200 for looking up and/or computing CTC signals. The data structures include a lookup area 1202 and a number of data areas 1204(1)-1204(n). Each of the data areas contains reaction data that indicates how to set and/or reset CTC signals in response to a dynamic condition being met, in an embodiment. Each data area uses a different format to store the reaction data. The lookup area 1202 contains data that is used to locate reaction data for a particular sub-clock, in an embodiment.

In some embodiments, the CTC signals are divided into a number of groups. There is a separate data structure 1200 for each group of CTC signals, in one embodiment. The data structures 1200 are stored in core processor storage 812, in one embodiment.

Figure 12B:
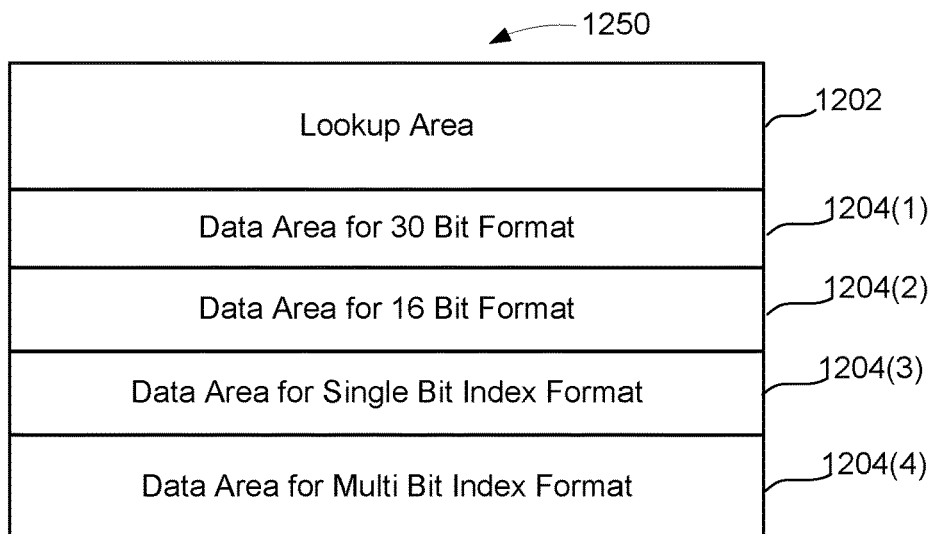
FIG. 12B illustrates an embodiment of data structures for looking up and/or computing CTC signals, in which there are four different formats for the reaction data.

FIG. 12B illustrates an embodiment of data structures 1250 for looking up and/or computing CTC signals, in which there are four different formats for the reaction data. The reaction data has what is referred to herein as a 30-bit format in area 1204(1). The reaction data has what is referred to herein as a 16-bit format in area 1204(2). The reaction data has what is referred to herein as a single bit index format in area 1204(3). The reaction data has what is referred to herein as a multi bit index format in area 1204(4). Further details of embodiments of each of these four formats are discussed below.

Figure 13:
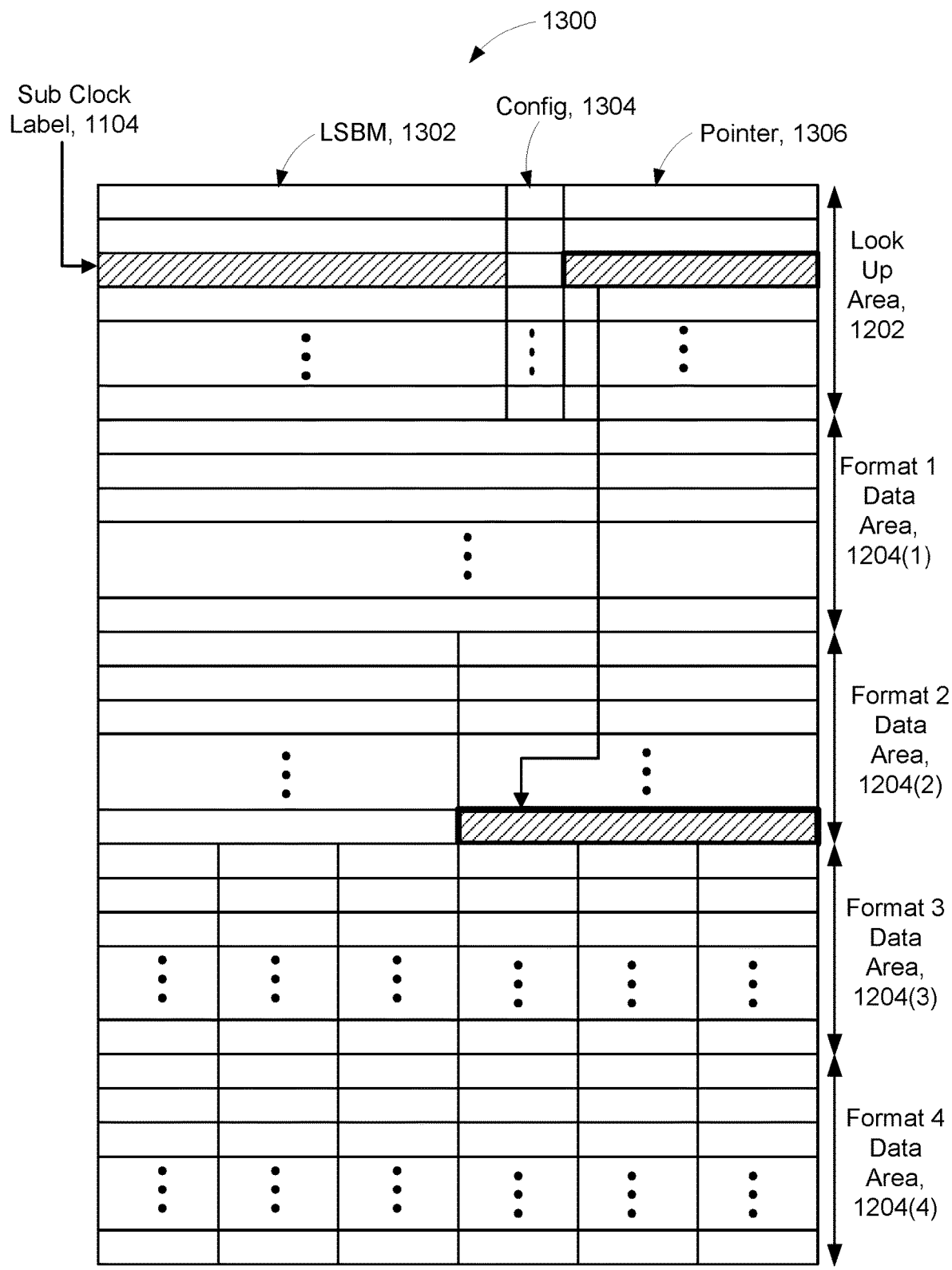
FIG. 13 illustrates an embodiment of data structures, as well as some details for looking up reaction data based on the look data.

FIG. 13 illustrates an embodiment of data structures 1300, as well as some details for looking up reaction data based on the lookup data. The lookup area 1202 is organized as rows of entries. Each row is 32 bits (one word) in one embodiment. The row could have more or fewer than 32 bits. Each entry (e.g., row) includes a local static bit map (LSBM) 1302, a configuration (config) field 1304, and a pointer 1306.

There is a separate data structure 1300 for each group of CTC signals, in one embodiment. The LSBM 1302 specifies what conditions are generally applicable to one of the groups of CTC signals, in an embodiment. The conditions in the LSBM 1302 are referred to herein as "static conditions," as these conditions typically do not change during runtime of the memory device. In other words, a given LSBM 1302 is typically not altered during runtime, in an embodiment. However, the LSBM 1302 may be modified by, for example, a firmware update. This allow the generation of the CTC signals to be modified using a firmware update.

The configuration field 1304 specifies which data format is being used. The configuration field 1304 may be, for example, two bit field in order to specify one of four data formats. The pointer 1306 is a pointer to reaction data in one of the format areas 1204.

The core processor 802 uses the sub-clock label 1104 from a packet 1100 in order to locate one entry (e.g., row) of the lookup area 1202. One of the LSBM 1302 is highlighted to indicate that this LSBM will be used in generation of the CTC signals for this sub-clock. One of the pointers 1306 is highlighted to indicate that the pointer is used to locate an entry in the reaction data in format 2 data area 1204(2), in this example. One or more CTC signals are set or reset based on the reaction data in that entry. One or more additional entries that follow the highlighted entry in data area 1204(2) may also be used to set/reset one or more CTC signals. Further details are discussed below for several different data formats.

Figure 14A:
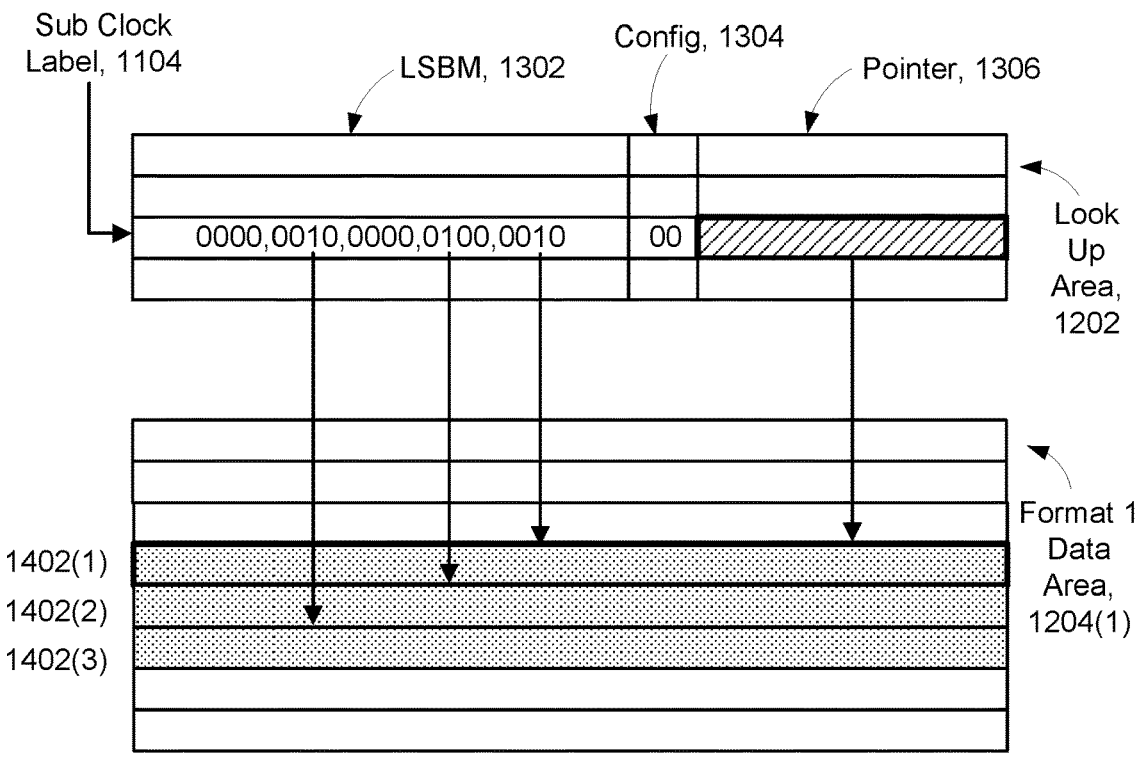
FIGS. 14A, 14B, 14C, and 14D depict embodiments of using the lookup area to locate reaction data having various formats.

FIG. 14A shows an example of using the lookup area 1202 to locate reaction data in format 1 data area 1204(1). The format 1 data area 1204(1) is a 32 bit format, in an embodiment. The sub-clock label 1104 (accessed from a packet 1100 from CLK FIFO 832, in an embodiment) is used to locate an entry in the lookup area 1202. The configuration field is "00", which indicates format 1, in this example. Thus, the pointer 1306 is used to locate an entry 1402(1) in format 1 data area 1204(1). The LSBM 1302 is used to locate additional entries 1402(2) and 1402(3). In this example, the LSBM 1302 has three bits set to "1". These three bits refer to static conditions that are applicable to this group of CTC signals in general. One entry 1402 is located for each of the three bits. The three entries are the entry 1402(1) pointed to by pointer 1306 and the two entries at the next addresses. In this example, each entry 1402 is 32 bits. It is possible that a static condition in the LSBM 1302 is not met for a given sub-clock. In other words, it is possible that a static condition in the LSBM 1302 is not present in the dynamic bit map 1110 for a given packet 1100. In that case, the entry in the reaction data pointed to by that bit in the LSBM 1302 is not applicable to the group of CTC signals for this sub-clock. Further details of setting/resetting CTC signals based on entries 1402 will be discussed below.

Figure 14B:
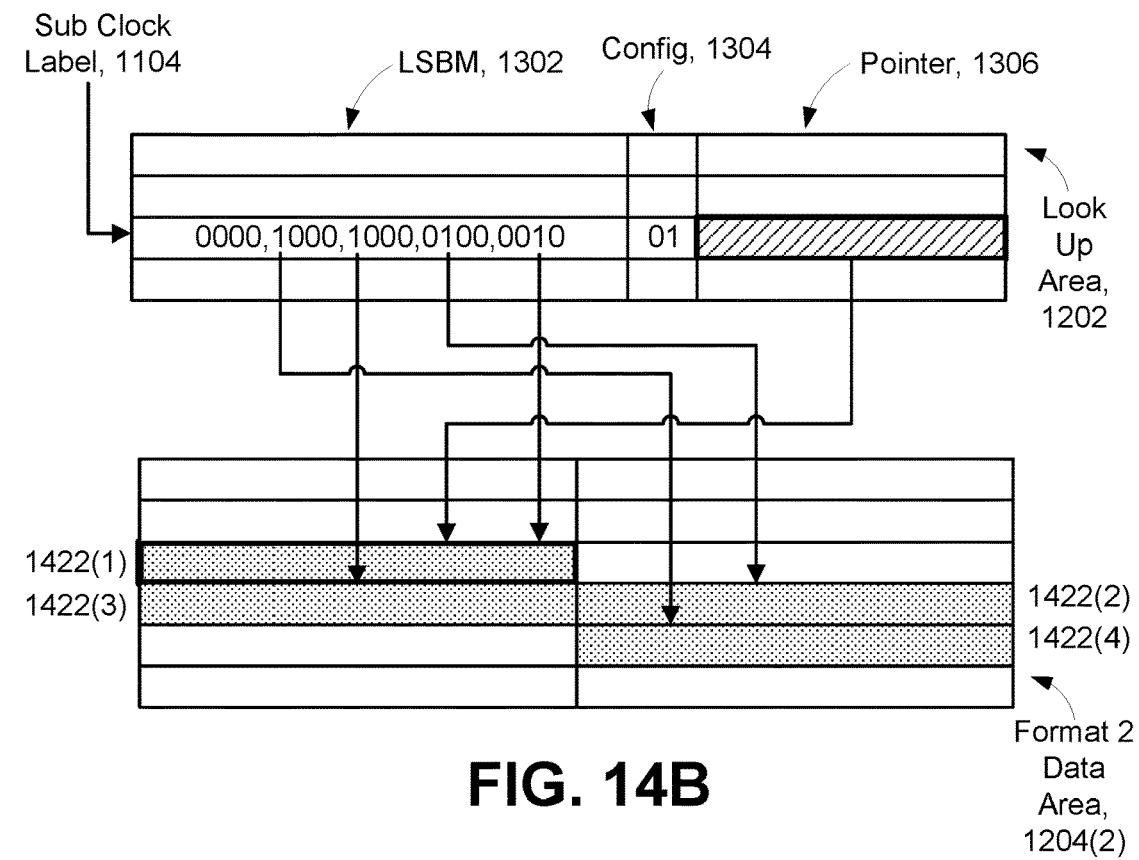

FIG. 14B shows an example of using the lookup area 1202 to locate reaction data in format 2 data area 1204(2). The format 2 data area 1204(2) is a 16-bit format, in an embodiment. The sub-clock label 1104 (accessed from a packet 1100 from CLK FIFO 832, in an embodiment) is used to locate an entry in the lookup area 1202. The configuration field is "01", which indicates format 2, in this example. Thus, the pointer 1306 is used to locate an entry 1422(1) in format 2 data area 1204(2). The LSBM 1302 is used to locate additional entries 1422(2), 1422(3), and 1422(4). In this example, the LSBM 1302 has four bits set to "1". These four bits refer to static conditions that are applicable to this group of CTC signals in general. One entry 1422 is located for each of the four bits. The four entries are the entry 1422(1) pointed to by pointer 1306 and the three entries at the next addresses. In this example, each entry 1422 is 16 bits. Further details of setting/resetting CTC signals based on entries 1422 will be discussed below.

Figure 14C:
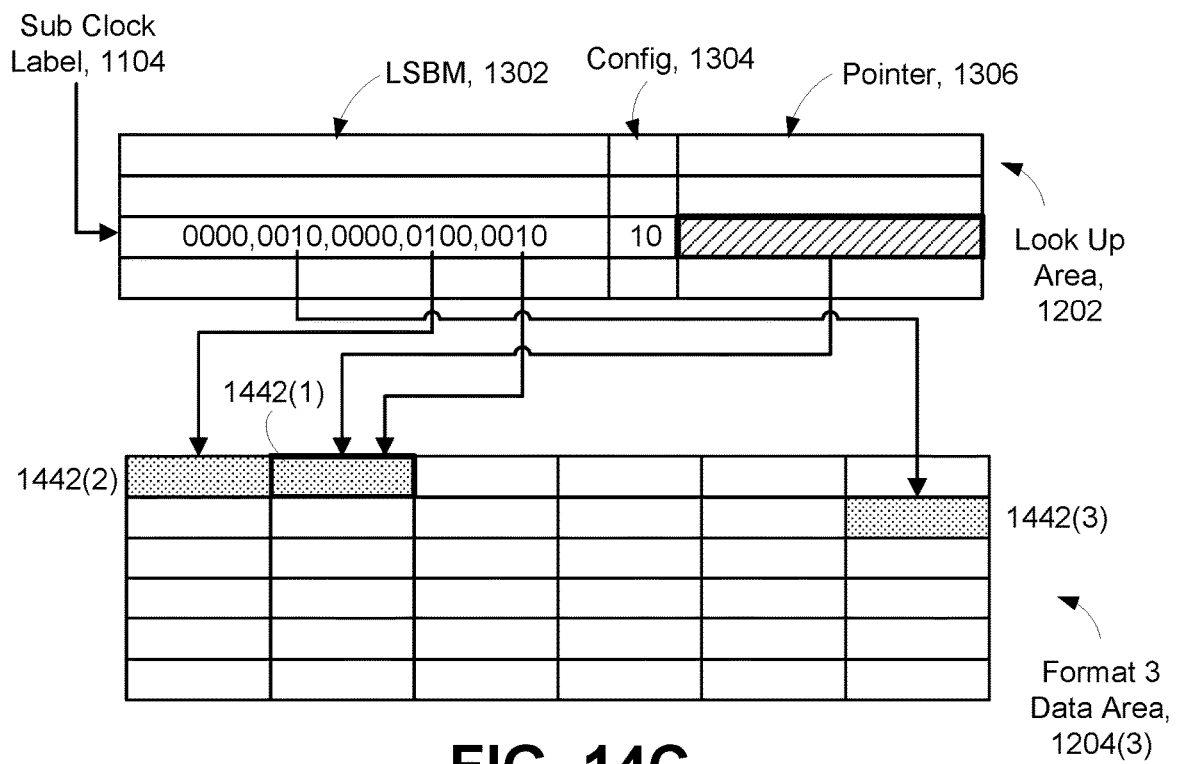

FIG. 14C shows an example of using the lookup area 1202 to locate reaction data in format 3 data area 1204(3). The format 3 data area 1204(3) is a single bit index format, in an embodiment. The sub-clock label 1104 (accessed from a packet 1100 from CLK FIFO 832, in an embodiment) is used to locate an entry in the lookup area 1202. The configuration field is "10", which indicates format 3, in this example. Thus, the pointer 1306 is used to locate an entry 1442(1) in format 3 data area 1204(3). The LSBM 1302 is used to locate additional entries 1442(2), and 1442(3). In this example, the LSBM 1302 has three bits set to "1". These three bits refer to static conditions that are applicable to this group of CTC signals in general. One entry 1442 is located for each of the three bits. The three entries are the entry 1422(1) pointed to by pointer 1306 and the two entries at the next addresses. Note that in this example, the least significant one bit points to entry 1442(1), the next least significant one bit points to entry 1442(2), and the most significant one bit points to entry 1442(3). In this example, there are six entries per row. Each of the six entries contains five bits, in an embodiment. Thus, there are 30 bits for the six entries in a row, in an embodiment. Thus, the six entries are slightly smaller than a word (e.g., 32 bits), in an embodiment. Further details of setting/resetting CTC signals based on entries 1442 will be discussed below.

Figure 14D:
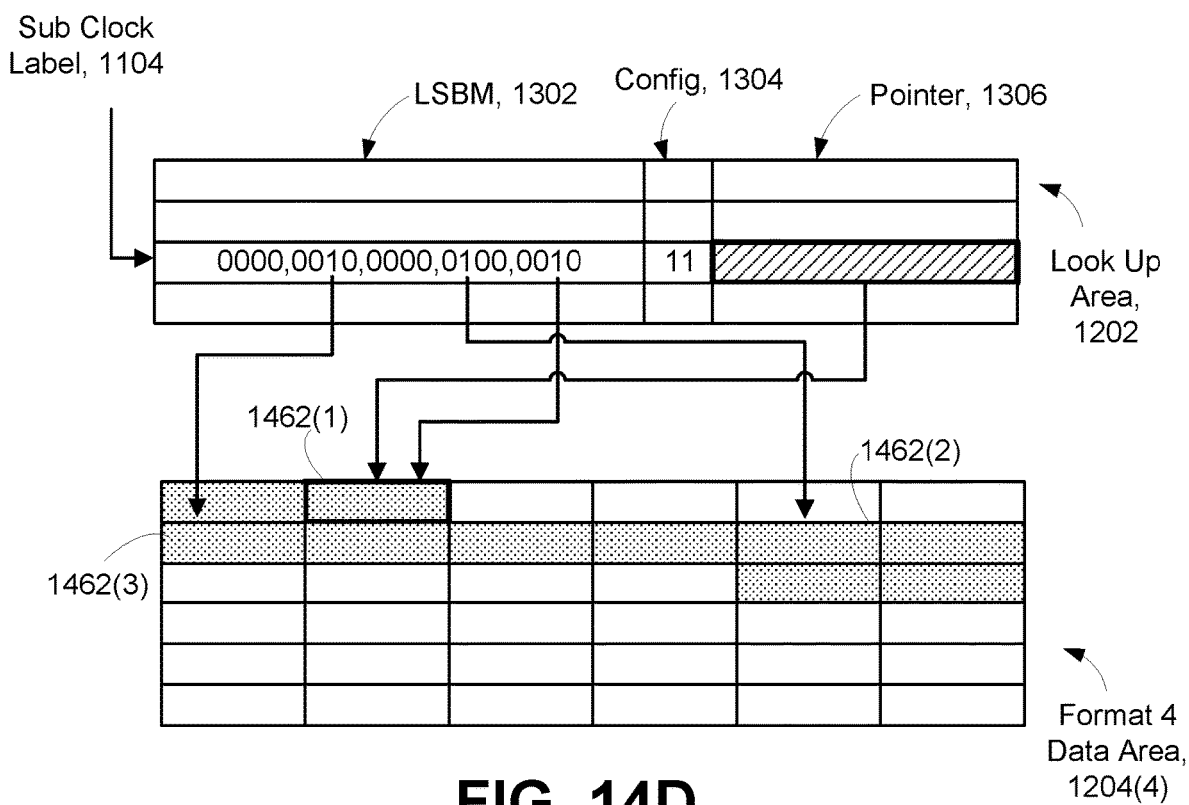

FIG. 14D shows an example of using the lookup area 1202 to locate reaction data in format 4 data area 1204(4). The format 4 data area 1204(4) is a multi-bit index format, in an embodiment. The sub-clock label 1104 (accessed from a packet 1100 from CLK FIFO 832, in an embodiment) is used to locate an entry in the lookup area 1202. The configuration field is "11", which indicates format 4, in this example. Thus, the pointer 1306 is used to locate the beginning of entry 1462(1) in format 4 data area 1204(4). The LSBM 1302 is used to locate the beginning of additional entries 1462(2)-1442(6). In this example, the entries may have different lengths, as will be explained below. The LSBM 1302 has three bits set to "1". These three bits refer to static conditions that are applicable to this group of CTC signals in general. In this example, the least significant one-bit points to entry 1462(1), the next least significant one bit points to entry 1462(2), and the most significant one bit points to entry 1462(3). In this example, length of each entry 1462 depends on how many CTC signals change in response to the condition. For example, the condition for entry 1462(1) may affect two CTC signals. Assuming each of the blocks (units) in format area 1204(4) is five bits, the entry may have three of these five bits units. As another example, the condition for entry 1462(2) may affect three CTC signals. The three units to the left of unit 1462(2) may specify these three CTC signals. Further details of setting/resetting CTC signals based on entries 1462 will be discussed below.

Figure 15:
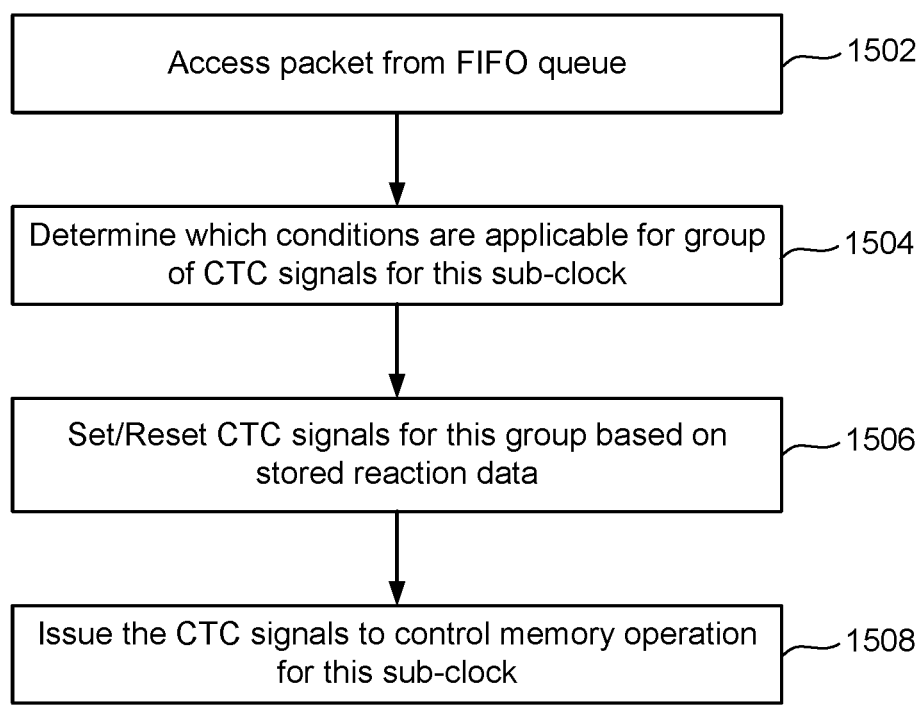
FIG. 15 is a flowchart of one embodiment of processing packets in order to generate CTC signals.

FIG. 15 is a flowchart of one embodiment of a process 1500 of processing packets 1100 in order to generate CTC signals. The process 1500 is performed by MCU 112, in one embodiment. The process 1500 is performed by core processor 802, in one embodiment. The process 1600 is performed for a group of CTC signals. There may be several (or numerous) groups of CTC signals, in which case the process 1500 may be performed in parallel for each of the groups.

Step 1502 includes accessing a packet from the CLK FIFO queue 832. Note that the same packet may be processed for each group of CTC signals. In one embodiment, the packet 1100 comprises a field that specifies dynamic conditions that are globally relevant during a sub-clock of a memory operation on memory structure 126. By globally relevant, it is meant that the dynamic conditions are relevant to at least one of the groups of CTC signals during the sub-clock. For example, the dynamic conditions might be applicable to a group of CTC signals that pertain to a read operation, but not to a group of CTC signals that pertain to a program operation. In one embodiment, the packet 1100 has a dynamic bit map 1110 to indicate the dynamic conditions.

Step 1504 includes determining which dynamic conditions are applicable for the group of CTC signals for a segment of the memory operation. Step 1504 includes determining which of the dynamic conditions are applicable during the sub-clock for the group of CTC signals. This determination is based on static conditions that are applicable for the group of CTC signals for this sub-clock, in an embodiment. The static conditions are specified in an LSBM 1302 for the group, in one embodiment.

Step 1506 includes setting or resetting one or more CTC signals in the group based on stored reaction data. The reaction data specifies whether to set or reset CTC signals based on each of the dynamic conditions that are applicable for the group during the sub-clock. The reaction data is stored in one of the format areas 1204, in one embodiment.

Step 1508 includes issuing the group of CTC signals to control the segment of the memory operation on the memory structure 126.

Figure 16:
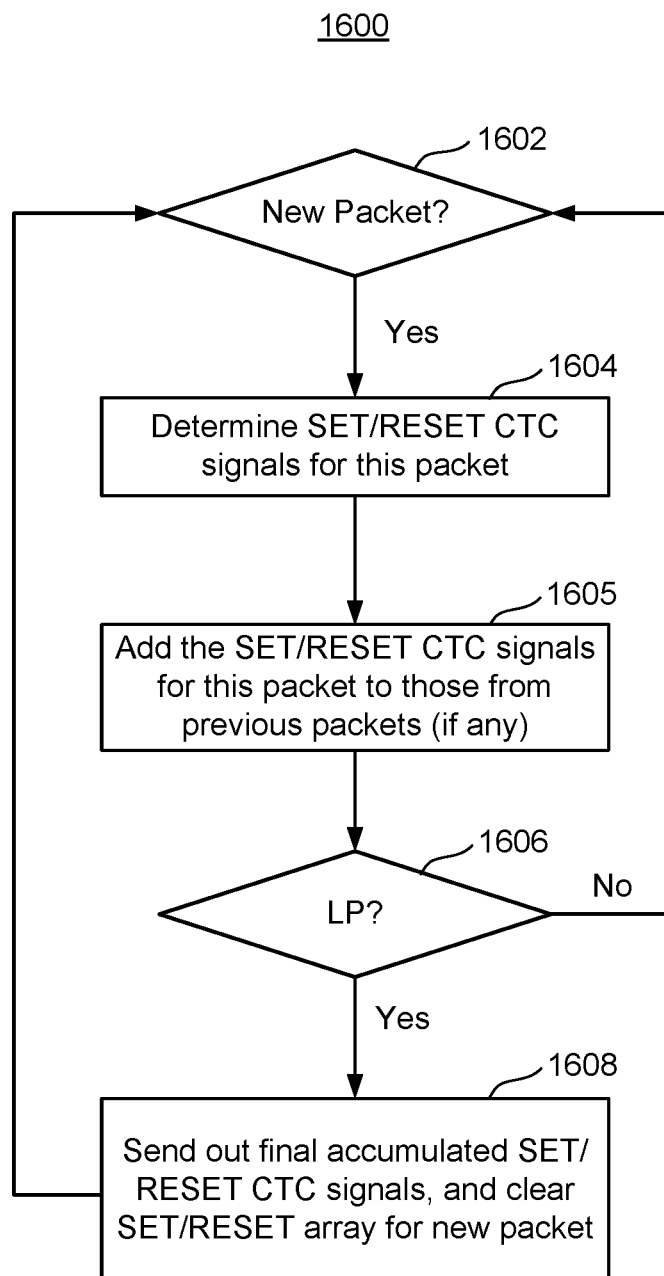
FIG. 16 is a flowchart of one embodiment of processing packets in order to generate CTC signals.

FIG. 16 is a flowchart of one embodiment of a process 1600 of processing packets 1100 in order to generate CTC signals. The process 1600 is performed by MCU 112, in one embodiment. The process 1600 is performed by core processor 802, in one embodiment.

Step 1602 includes a determination of whether a new packet 1100 is on the CLK FIFO queue 832. If not, no action is taken until a new packet arrives on the CLK FIFO queue 832. Step 1604 is performed when a new packet arrives. Step 1604 includes determining which CTC signals are affected by dynamic conditions in this packet. Step 1604 also includes whether to set or reset the affected CTC signals. Step 1605 includes adding the SET/RESET CTC signals for this packet to any SET/RESET CTC signals from previous packets (if any). Thus, the affect is to combine SET/RESET CTC signals from the packets with each other, in an embodiment.

Step 1606 includes a determination of whether this is the last packet for this sub-clock. With reference to FIG. 11, the core processor 802 checks the LP field 1106, in one embodiment. If this is not the last packet, then the process returns to step 1602 to access the next packet. If this is the last packet for the sub-clock, then step 1608 is performed. In step 1608, the CLK FIFO queue 832 is updated. In one embodiment, the final accumulated SET/RESET CTC signals are sent out. In one embodiment, the SET/RESET array (see Set/Reset array 1704, FIG. 17) for the new packet is cleared.

Figure 17:
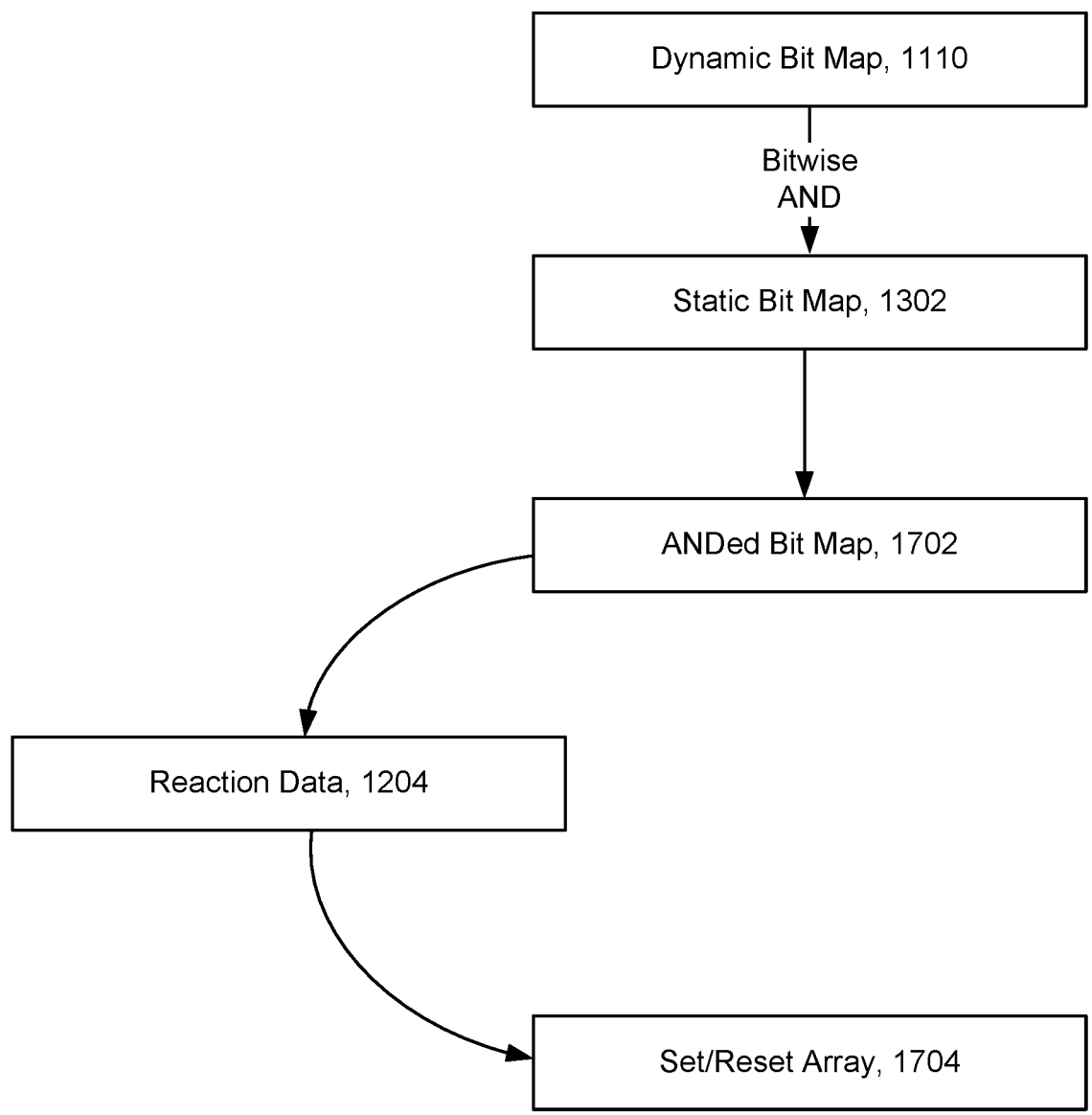
FIG. 17 illustrates several data structures that are used when setting/resetting CTC signals, in one embodiment.

FIG. 17 illustrates how several data structures are used to set/reset CTC signals, in one embodiment. The data structures include a dynamic bit map 1110, a local static bit map 1302, an ANDed bit map 1702, reaction data 1204, and a set/reset array 1704. Embodiments of the dynamic bit map 1110, local static bit map 1302, and reaction data 1204 have been discussed. The ANDed bit map is formed by a bit-wise logical AND of the dynamic bit map 1110 and the LSBM 1302, in one embodiment. The set/reset array indicates whether various CTC signals are to be set or reset (or to remain unchanged). The reaction data 1204 is used to store the proper values in the set/reset array. In one embodiment, for each CTC signal there is a one-bit field for set and a one-bit field for reset in the set/reset array 1704. If the CTC signal is to be set, then the one-bit field for set is written with a "1". If the CTC signal is to be reset, then the one-bit field for reset is written with a "1". Thus, if the CTC signal is to remain the same, then both these fields should contain a "0". There may be one set/reset array 1704 for all of the groups of CTC signals. Alternatively, each group of CTC signals could have its own set/reset array 1704. The use of the data structures will be discussed in more detail in connection with the process depicted in FIG. 18.

Figure 18:
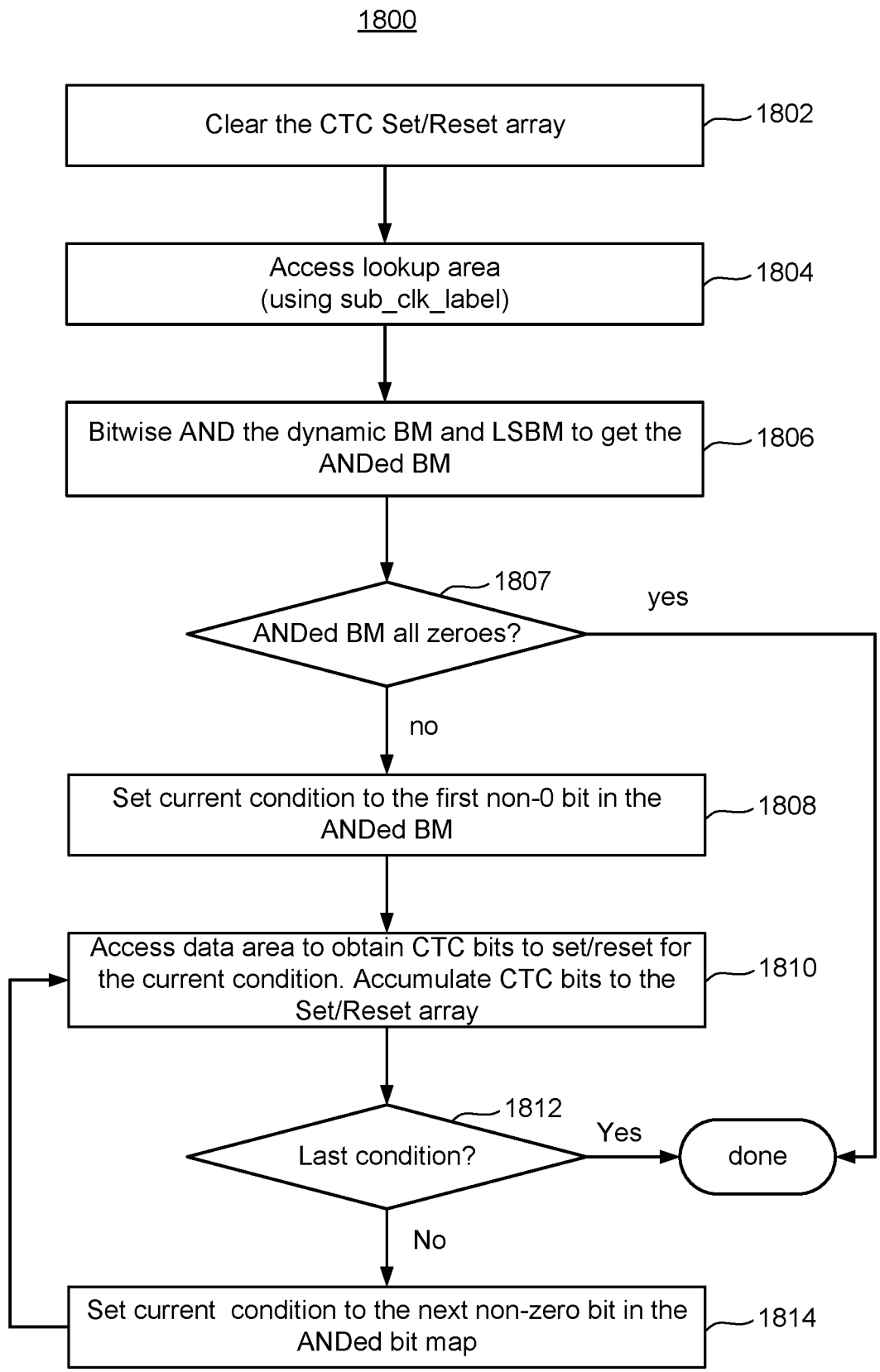
FIG. 18 is a flowchart of one embodiment of generating CTC signals.

FIG. 18 is a flowchart of one embodiment of generating CTC signals. The process 1800 is performed by MCU 112, in one embodiment. The process 1800 is performed by core processor 802, in one embodiment. The process 1800 is performed for a group of CTC signals. There may be several (or numerous) groups of CTC signals, in which case the process 1800 may be performed in parallel for each of the groups.

Step 1802 includes clearing the CTC set/reset array 1704. Clearing the array includes setting all bits to "0", in one embodiment. Step 1804 includes accessing the lookup area 1202. Step 1804 may include using the sub-clock label 1104 in the packet 1100 in order to obtain a LSBM 1302, in one embodiment.

Step 1806 includes performing a logical bit-wise AND of the dynamic bit map 1110 and the LSBM 1302 to generate the ANDed bit map 1702. Step 1806 is one way to determine which dynamic conditions (which are met for this sub-clock) are applicable to the group of CTC signals for this sub-clock.

Step 1807 is a determination of whether the ANDed BM 1702 is all zeroes. If so, the process concludes. If the ANDed BM 1702 is not all zeroes (i.e., has at least one "1"), then the process continues at step 1808.

Step 1808 includes setting a current condition to the first non-zero bit in the ANDed bit map 1702. The current condition refers to the dynamic condition that is to be analyzed. For purpose of discussion, the process will be explained by focusing on analyzing one dynamic condition at a time.

Step 1810 includes accessing the data area 1204 to obtain the CTC bits to set/reset for the current dynamic condition. Each CTC bit refers to one of the CTC signals. The value of the bit indicates whether the CTC signal is to be set or reset. The CTC bits are accumulated in the Set/Reset array 1704. If this is the last dynamic condition to analyze (as determined by step 1812), then the process concludes. Otherwise, the current dynamic condition is set to the next non-zero bit in the ANDed bit map 1702, in step 1814. Then, step 1810 is performed to analyze the dynamic condition.

FIGS. 19-22 provide further details of embodiments of using reaction data to set/reset CTC signals. FIG. 19 depicts reaction data 1900 for an embodiment having a 30-bit format. The reaction data 1900 is pertinent to 15 CTC signals, which are numbered 0 to 14. The address column 1902 contains the address of each entry. Three entries are depicted. Each entry is associated with one condition. In this example one CTC signal is either set or reset for each condition. For the condition associated with Address 1, CTC signal 2 is SET. For the condition associated with Address 2, CTC signal 5 is SET. For the condition associated with Address 2, CTC signal 7 is RESET. Any number of the CTC signals could be set or reset using this format. The format can be modified to cover more or fewer than 15 CTC signals. Note that the "Res" column is reserved. The reserved field is two bits, one embodiment. The reserved field could be used to add another CTC signal for this condition using, for example, a firmware update. The embodiment depicted in FIG. 19 is referred to as a 30-bit embodiment due to the use of 30 bits for the 15 CTC signals. The two-bits for the reserved field are used to align the reaction data to a word (e.g., 32 bit) address.

FIG. 20 depicts reaction data 2000 for an embodiment having a 16-bit format. The reaction data 2000 is pertinent to 15 CTC signals 2004, which are numbered 0 to 14. The address column 2002 contains the address of up to two entries. Three entries are depicted. Each entry is associated with one condition. In this example multiple CTC signals may be either set or reset for each condition. However, either all of the CTC signals are set or all of the CTC signals are reset for the condition. This saves storage, as there is no need to specify either set or reset for each CTC signal (as in the 30-bit example of FIG. 19).

For the right entry associated with Address 1, CTC signal 2 is SET. This is indicated by the value of "1" for CTC signal 2, along with the value of "1" in the S/R field 2006 adjacent to the entry. For the left entry associated with Address 1, CTC signal 2 and CTC signal 5 are SET. This is indicated by the value of "1" for CTC signals 2 and 5, along with the value of "1" in the S/R field 2006 adjacent to the entry. For the right entry associated with Address 2, CTC signal 1 and CTC signal 7 are RESET. This is indicated by the value of "1" for CTC signals 1 and 7, along with the value of "0" in the S/R field 2006 adjacent to the entry.

Note that the formats in FIGS. 19 and 20 both cover 15 CTC signals, but in different formats. It would be possible to modify the embodiment of FIG. 19 to cover 16 CTC signals if the reserved field were to be used for an additional CTC signal. However, this would mean that information that could be expressed in this modified example of FIG. 19 could not be expressed in the format of FIG. 20. Hence, a reason for the reserved field in FIG. 19 is to have better compatibility between the formats.

Figure 21:
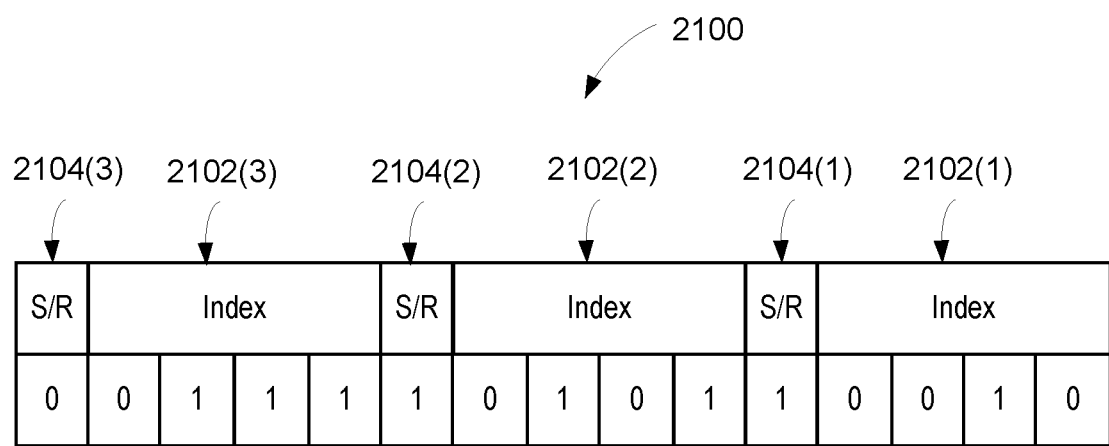
FIG. 21 depicts reaction data for an embodiment having a single index format.

FIG. 21 depicts reaction data 2100 for an embodiment having a single index format. The reaction data 2100 is pertinent to 3 CTC signals, which are specified by an Index 2102. Index 2102(1) specifies CTC signal 2. Index 2102(2) specifies CTC signal 5. Index 2102(3) specifies CTC signal 7. The four bit index may specify up to 16 different CTC signals. More or fewer than four bits can be used for the index 2102. The set/reset field 2104 indicates whether the specified CTC signal is to be set or reset. For example, S/R 2104(1) is "1" to indicate that CTC signal 2 (specified by Index 2102(1)) is to be set; S/R 2104(2) is "1" to indicate that CTC signal 5 (specified by Index 2102(2)) is to be set; and S/R 2104(1) is "0" to indicate that CTC signal 7 (specified by Index 2102(3)) is to be reset. FIG. 21 shows a total of 15 bits being used. Six of such entries can be used per row of the data area for the single index format 1204(3), for a total of 30 bits. Alignment to a word may be achieved by leaving two bits per row unused.

Figure 22:
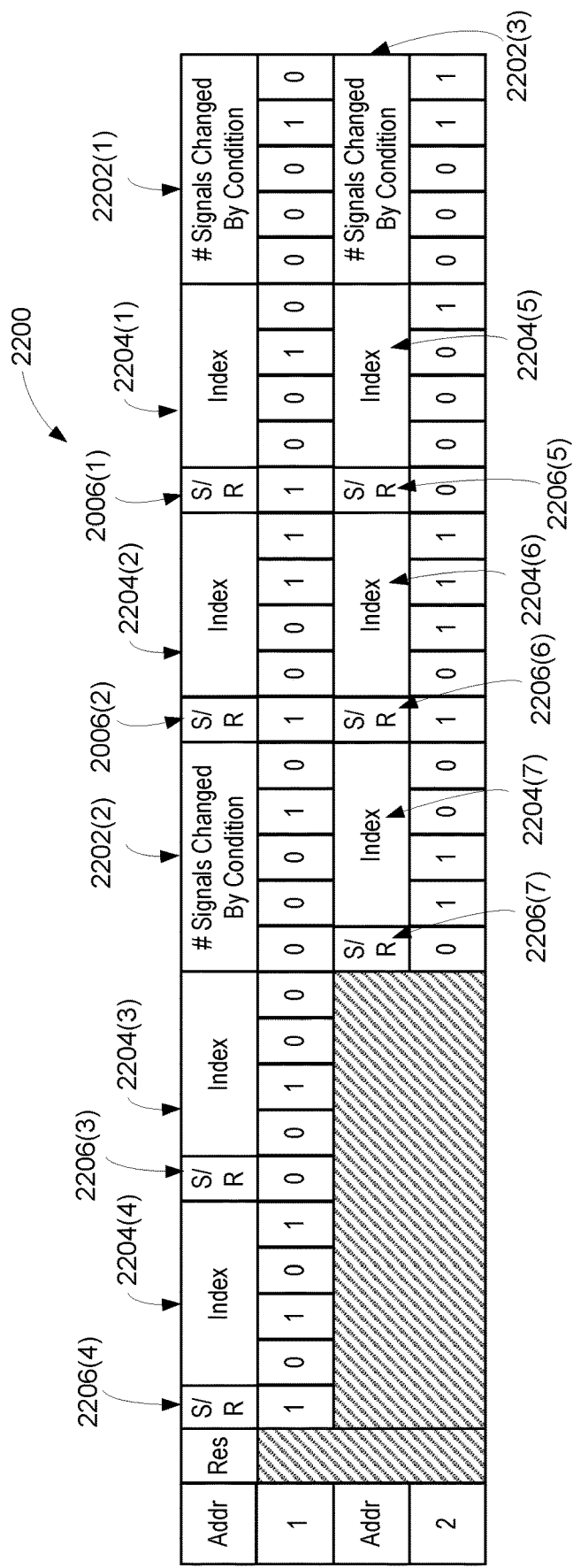
FIG. 22 depicts reaction data for an embodiment having multi-index format.

FIG. 22 depicts reaction data 2200 for an embodiment having multi-index format. The reaction data 2200 is pertinent to 7 CTC signals, and three conditions. Field 2202(1) indicates that two CTC signals are affected by the condition for this entry. Index 2204(1) and index 2204(2) specify the two signals. Index 2204(1) specifies CTC signal 2, and Index 2204(2) specifies CTC signal 3. S/R field 2206(1) specifies that CTC signal 2 is to be set (due to the value of "1"). S/R field 2206(2) specifies that CTC signal 3 is to be set (due to the value of "1"). These foregoing fields constitute the entry for the condition, in one embodiment.

Field 2202(2) indicates that two CTC signals are affected by the condition for this entry. Index 2204(3) and index 2204(4) specify the two signals. Index 2204(3) specifies CTC signal 4, and Index 2204(4) specifies CTC signal 5. S/R field 2206(3) specifies that CTC signal 4 is to be reset (due to the value of "0"). S/R field 2206(4) specifies that CTC signal 5 is to be set (due to the value of "1"). These foregoing fields constitute the entry for the condition, in one embodiment.

Field 2202(3) indicates that three CTC signals are affected by the condition for this entry. Index 2204(5), index 2204(6), and index 2204(7) specify the three CTC signals. S/R field 2206(5) specifies that CTC signal 1 (specified in index 2204(5)) is to be reset (due to the value of "0"). S/R field 2206(6) specifies that CTC signal 7 (specified in index 2204(6)) is to be set (due to the value of "1"). S/R field 2206(7) specifies that CTC signal 12 (specified in index 2204(7)) is to be reset (due to the value of "0"). These foregoing fields constitute the entry for the condition, in one embodiment.

The format in FIG. 22 uses 30 bits for the six entries in a row, in an embodiment. The reserved field (Res) of two-bits is used to have the addresses align on words (e.g., 32 bits), in an embodiment. Thus, the four formats align well with each other. For example, all four formats can align to word boundaries with a minimum of wasted space (in the form of reserved fields).

As can be seen from the examples in FIG. 19-22, some formats use less storage per condition than other formats. Likewise, some formats use less storage per CTC signal than other formats. For example, a 16-bit format embodiment depicted in FIG. 20 uses less storage per condition (a well as less storage per CTC signal) than the 30-bit format embodiment depicted in FIG. 19. The 16-bit format embodiment depicted in FIG. 20 is limited by the fact that all CTC signals must either be set or reset in response to a particular condition being met. However, in many cases there are multiple CTC signals that will all be set or reset in response to a particular condition being met. This may be due to how CTC signals may be grouped based on similar functionality. For example, CTC signals that have similar effects on the voltages applied to the memory core may be grouped together. Hence, the 16-bit format embodiment can be quite useful in reducing storage requirements.

The single-index format embodiment depicted in FIG. 21 is very storage efficient. The single-index format embodiment depicted in FIG. 21 is limited by the fact that only a single CTC signal may be set/reset in response to a particular condition being met. The multi-index format embodiment depicted in FIG. 22 does not suffer from this limitation. That is, the multi-index format embodiment depicted in FIG. 22 allows more than one CTC signal to be changed in response to a particular condition being met. A potential drawback to the multi-index format embodiment depicted in FIG. 22 is the additional complexity created by the fact that entries could be of different lengths (due to the need to have an index field for each CTC signal that is affected by the particular condition being met).

In some embodiments, a very high percentage of the CTC signals can use a single-bit index format embodiment, which is very storage efficient. A very small percentage of the CTC signals might require a 30-bit format embodiment. Therefore, the storage requirements for the CTCs signals is kept low by selecting a storage efficient format for a significant percentage of the CTC signals, in some embodiments.

Accordingly, it can be seen that, in a first embodiment, an apparatus is provided that includes a memory structure comprising non-volatile memory cells; storage containing reaction data that specifies whether to set or reset core timing control signals in response to a dynamic condition being met; and one or more control circuits. The one or more control circuits are configured to determine a set of dynamic conditions that are applicable to a group of core timing control signals during a segment of a memory operation. The one or more control circuits are configured to set or reset one or more core timing control signals in the group for each condition in the set of dynamic conditions, based on the reaction data. The one or more control circuits are configured to use the group of core timing control signals to control the segment of the memory operation in the memory structure.

In a second embodiment, in furtherance of the first embodiment, the one or more control circuits are further configured to determine the set of dynamic conditions that are that are applicable to the group of core timing control signals during the segment of the memory operation from: dynamic conditions that are applicable to at least one core timing control signal in the group or other groups of core timing control signals during the segment of the memory operation; and a set of static conditions that are applicable to the group of core timing control signals during the segment of the memory operation.

In a third embodiment, in furtherance of the first or second embodiments, the one or more control circuits comprise: a main processor configured to place packets on a first-in first out (FIFO) queue, each packet comprising information to lookup reaction data for a segment of the memory operation specified in the packet; and a core processor configured to process the packets from the FIFO in order to generate the core timing control signals for the segment of the memory operation specified in the packet.

In a fourth embodiment, in furtherance of any of the first to third embodiments, each packet comprises a sub-clock label that specifies the segment of the memory operation and a dynamic bit map that specifies a set of dynamic conditions that are applicable to at least one core timing control in the group or other groups of core timing control signals during the segment of the memory operation.

In a fifth embodiment, in furtherance of any of the first to fourth embodiments, the one or more control circuits are further configured to use the sub-clock label to lookup a static bit map that specifies a set of static conditions that are applicable to the group of core timing control signals during the segment of the memory operation specified by the sub-clock label; and determine the set of dynamic conditions that are applicable to the group of core timing control signals during the segment of the memory operation based on the dynamic bit map and the static bit map.

In a sixth embodiment, in furtherance of any of the first to fifth embodiments, the one or more control circuits are further configured to: access reaction data for the set of dynamic met conditions that are applicable to the group of core timing control signals during the segment of the memory operation; and set or reset one or more core timing control signals in the group based on the reaction data.

In a seventh embodiment, in furtherance of any of the first to sixth embodiments, the reaction data comprises a plurality of formats that use a different number of bits to store the reaction data that is associated with a single one of the dynamic conditions.

In an eighth embodiment, in furtherance of any of the first to seventh embodiments, the plurality of formats comprise a format in which either all core timing control signals that are changed in response to a dynamic condition being met are set or all core timing control signals that are changed in response to the dynamic condition being met are reset.

In a ninth embodiment, in furtherance of any of the first to eighth embodiments, the plurality of formats comprise a format that comprises entries each having a single index that specifies a core timing control signal and a field that specifies whether the core timing control signal is set or reset.

In a tenth embodiment, in furtherance of any of the first to ninth embodiments, the plurality of formats comprise a format that comprises entries each having a first field that indicates how many core timing control signals are changed in response to a dynamic condition being met, an index for each core timing control signal that is changed in response to the dynamic condition being met, and information that specifies whether the core timing control signal is set or reset.

An embodiment includes a method comprising accessing a packet from a first-in first-out (FIFO) queue. The packet comprises a field that specifies first dynamic conditions that are globally relevant during a sub-clock of a memory operation on a memory structure comprising non-volatile memory cells. The method comprises determining second dynamic conditions that are applicable to a group of core timing control signals during the sub-clock. The determining is based on the first dynamic conditions and static conditions that are applicable to the group of core timing control signals during the sub-clock. The method comprises setting or resetting one or more core timing control signals in the group based on stored reaction data that specifies whether to set or reset core timing control signals based on each second dynamic condition. The method comprises issuing the group of core timing control signals to control voltages applied to the memory structure during the sub-clock of the memory operation.

An embodiment includes a non-volatile storage device comprising a memory array comprising non-volatile memory cells, and storage comprising reaction data that specifies whether to set or reset core timing control signals in response to dynamic conditions. The storage further comprises a lookup table for locating reaction data. The non-volatile storage device comprises a first processor configured to place packets on a first-in first-out (FIFO) queue. Each packet contains information for locating reaction data in the storage for a dynamic condition during a sub-clock of a memory operation in the memory array. The non-volatile storage device comprises a second processor configured to: set or reset one or more core timing control signals based on the reaction data and the information in the packets; and issue the one or more core timing control signals to control voltages applied to the memory array during the sub-clock of the memory operation.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to be connected to a memory structure comprising non-volatile memory cells, the one or more control circuits are configured to:
determine a set of dynamic conditions that are applicable to a group of core timing control signals for a segment of a memory operation;
access reaction data that specifies, for each dynamic condition that is applicable, whether to set or reset the core timing control signals;
based on the reaction data, set or reset one or more of the core timing control signals in the group for each condition in the set of dynamic conditions; and
use the group of core timing control signals to control timing of voltages applied to the memory structure to control the segment of the memory operation in the memory structure.

2. The apparatus of claim 1, wherein the one or more control circuits are further configured to set or reset the core timing control signals at a beginning of the segment of the memory operation.

3. The apparatus of claim 2, wherein the one or more control circuits are further configured to:
increase, at the beginning of the segment, a voltage that is applied to the memory structure in response to a corresponding core timing control signal being set; and
decrease, at the beginning of the segment, the voltage that is applied to the memory structure in response to a corresponding core timing control signal being reset.

4. The apparatus of claim 1, wherein the one or more control circuits are further configured to determine the set of dynamic conditions that are applicable to the group of core timing control signals during the segment of the memory operation from:
global dynamic conditions that are applicable to at least one core timing control signal in the group or other groups of core timing control signals during the segment of the memory operation; and
a set of static conditions that are applicable to the group of core timing control signals during the segment of the memory operation.

5. The apparatus of claim 1, wherein the one or more control circuits comprise:
a main processor configured to place packets on a first-in first out (FIFO) queue, each packet comprising information to lookup reaction data for a segment of the memory operation specified in the packet; and
a core processor configured to process the packets from the FIFO in order to generate the core timing control signals for the segment of the memory operation specified in the packet.

6. The apparatus of claim 5, wherein each packet comprises a sub-clock label that specifies the segment of the memory operation and a dynamic bit map that specifies a set of global dynamic conditions that are applicable to at least one core timing control in the group or other groups of core timing control signals during the segment of the memory operation.

7. The apparatus of claim 6, wherein the one or more control circuits are further configured to:
use the sub-clock label to lookup a static bit map that specifies a set of static conditions that are applicable to the group of core timing control signals during the segment of the memory operation specified by the sub-clock label, wherein the set of static conditions are not alterable during runtime; and
determine the set of dynamic conditions that are applicable to the group of core timing control signals during the segment of the memory operation based on the dynamic bit map and the static bit map.

8. The apparatus of claim 1, wherein:
the reaction data comprises a plurality of formats that use a different number of bits to store the reaction data that is associated with a single one of the dynamic conditions.

9. The apparatus of claim 8, wherein the plurality of formats comprise:
a format in which either all core timing control signals that are changed in response to a dynamic condition being met are set or all core timing control signals that are changed in response to the dynamic condition being met are reset.

10. The apparatus of claim 8, wherein the plurality of formats comprise:
a format that comprises entries each having a single index that specifies a core timing control signal and a field that specifies whether the core timing control signal is set or reset.

11. The apparatus of claim 8, wherein the plurality of formats comprise:
a format that comprises entries each having a first field that indicates how many core timing control signals are changed in response to a dynamic condition being met, an index for each core timing control signal that is changed in response to the dynamic condition being met, and information that specifies whether the core timing control signal is set or reset.

12. The apparatus of claim 1, wherein the dynamic conditions are based on one or more of: temperature, reference voltages, and mode of operation.

13. A method comprising:
accessing a packet from a first-in first-out (FIFO queue), the accessing performed by a microcontroller, the packet comprises a field that specifies first dynamic conditions that are relevant during a sub-clock of a memory operation on a memory structure comprising non-volatile memory cells;
accessing, by the microcontroller, static conditions that are applicable to a group of core timing control signals during the sub-clock, wherein the static conditions are not alterable during runtime;
determining, by the microcontroller, second dynamic conditions that are applicable to the group of core timing control signals during the sub-clock, the determining based on the first dynamic conditions and the static conditions;
setting or resetting, by the microcontroller, one or more core timing control signals in the group at the sub-clock, the setting or resetting based on stored reaction data that specifies whether to set or reset the core timing control signals based on each second dynamic condition; and
issuing the group of core timing control signals from the microcontroller to control voltages applied to the memory structure during the sub-clock of the memory operation.

14. The method of claim 13, further comprising:
specifying the first dynamic conditions in a first bit map in the packet;
accessing the static conditions from storage that stores a second bit map; and
performing a bit-wise logical AND of the first bit map and the second bit map to generate a third bit map that specifies which of the first dynamic conditions are applicable to the group of core timing control signals during the sub-clock, the third bit map specifies the second dynamic conditions.

15. A non-volatile storage device comprising:
a first processor configured to place packets on a first-in first-out (FIFO) queue, each packet containing information for locating reaction data for a condition for a sub-clock of a memory operation in a memory array; and
a second processor configured to:
locate the reaction data for the condition for the sub-clock of the memory operation, wherein the reaction data specifies whether to set or reset timing control signals in response to the condition;
generate one or more timing control signals based on the reaction data, the one or more timing control signals either having a rising edge or a falling edge at the sub-clock of the memory operation; and
issue the one or more timing control signals to control voltages applied to the memory array during the sub-clock of the memory operation.

16. The non-volatile storage device of claim 15, wherein:
the second processor is further configured to locate the reaction data based on information in each packet that specifies the sub-clock of the memory operation.

17. The non-volatile storage device of claim 15, wherein the reaction data comprises:
a format in which any timing control signals that is changed in response to a condition may be set or reset.

18. The non-volatile storage device of claim 15, wherein the reaction data comprises:
a format in which either all timing control signals that are changed in response to a condition are set or all timing control signals that are changed in response to the condition are reset.

19. The non-volatile storage device of claim 15, wherein the reaction data further comprises:
a format that comprises one or more indexes, each index specifying which timing control signal is set or reset in response to a condition.

20. The non-volatile storage device of claim 15, wherein the reaction data further comprises:
a format that that indicates, for each of a plurality of conditions, how many timing control signals are set or reset in response to the condition, the format further identifies which of the timing control signals are set or reset for each condition.

* * * * *